(12) United States Patent
Maher

(10) Patent No.: US 8,385,030 B2
(45) Date of Patent: Feb. 26, 2013

(54) COMPONENT FAULT DETECTION FOR USE WITH A MULTI-PHASE DC-DC CONVERTER

(75) Inventor: Timothy Maher, Branchburg, NJ (US)

(73) Assignee: Intersil Americas Inc., Milpitas, CA (US)

(*) Notice: Subject to any disclaimer, the term of this patent is extended or adjusted under 35 U.S.C. 154(b) by 599 days.

(21) Appl. No.: 12/691,589

(22) Filed: Jan. 21, 2010

(65) Prior Publication Data

US 2010/0315847 A1 Dec. 16, 2010

Related U.S. Application Data

(60) Provisional application No. 61/187,598, filed on Jun. 16, 2009, provisional application No. 61/187,607, filed on Jun. 16, 2009.

(51) Int. Cl.
*H02H 7/10* (2006.01)
(52) U.S. Cl. .......................................... 361/18; 323/272
(58) Field of Classification Search .................. 323/272, 323/283, 901; 361/18
See application file for complete search history.

(56) References Cited

U.S. PATENT DOCUMENTS

| | | | | |
|---|---|---|---|---|
| 6,424,129 B1 * | 7/2002 | Lethellier | | 323/272 |
| RE38,454 E * | 3/2004 | Walters et al. | | 323/272 |
| 6,795,009 B2 * | 9/2004 | Duffy et al. | | 341/155 |
| 7,126,315 B2 * | 10/2006 | Seo | | 323/272 |
| 7,466,116 B2 | 12/2008 | Sato et al. | | |
| 7,737,672 B2 * | 6/2010 | Kudo | | 323/284 |
| 8,030,911 B2 * | 10/2011 | Nien et al. | | 323/283 |
| 2003/0214274 A1 * | 11/2003 | Lethellier | | 323/272 |
| 2008/0111611 A1 | 5/2008 | Thiele et al. | | |
| 2009/0140706 A1 * | 6/2009 | Taufik et al. | | 323/272 |
| 2010/0315051 A1 * | 12/2010 | Maher | | 323/282 |
| 2010/0315847 A1 * | 12/2010 | Maher | | 363/50 |

OTHER PUBLICATIONS

DrMOS Specifications, Intel Corporation, Nov. 2004, Revision 1.0, pp. 1-17.
Amendment dated Nov. 20, 2012, in U.S. Appl. No. 12/691,438, filed Jan. 21, 2010.
Office Action dated Nov. 2, 2012, in U.S. Appl. No. 12/691,438, filed Jan. 21, 2010.

* cited by examiner

*Primary Examiner* — Jeffrey Sterrett
(74) *Attorney, Agent, or Firm* — Vierra Magen Marcus & DeNiro LLP

(57) ABSTRACT

Provided herein are circuits, systems and methods that monitor for a fault within a multi-phase DC-DC converter. This can include monitoring the channels of the DC-DC converter for way out of balance (WOB) conditions, and monitoring for a component fault in dependence on detected WOB conditions. A fault can be detected if, during a predetermined period of time, one of the WOB conditions occurs at least a specified amount of times more than another one of the WOB conditions. The DC-DC converter and/or another circuit can be shut-down in response to a fault being detected. Additionally, or alternatively, a component fault detection signal can be output in response to a fault being detected.

24 Claims, 15 Drawing Sheets

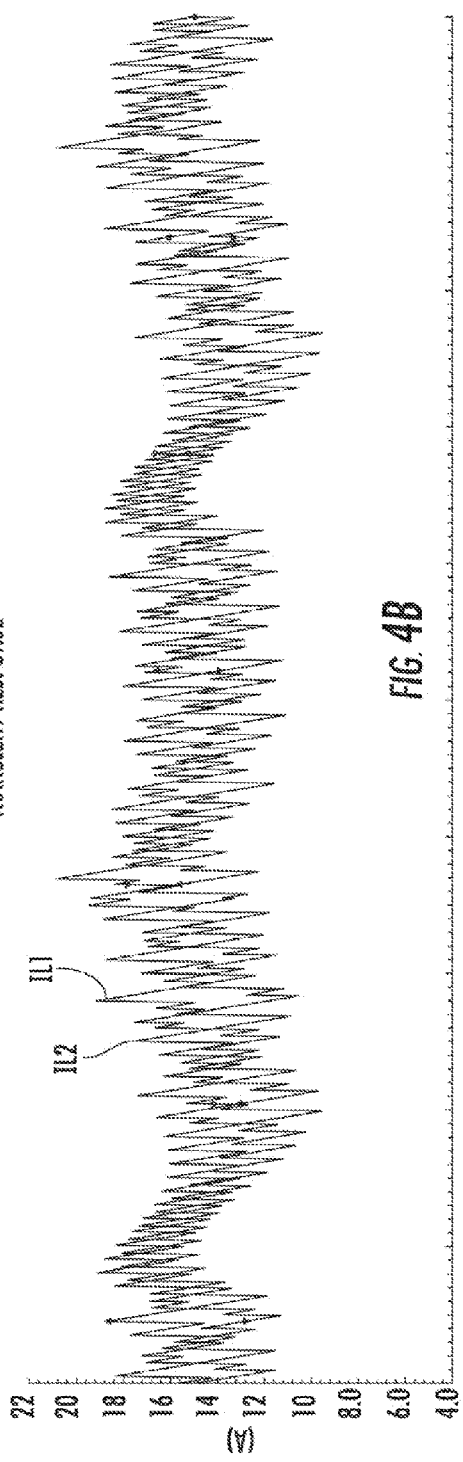
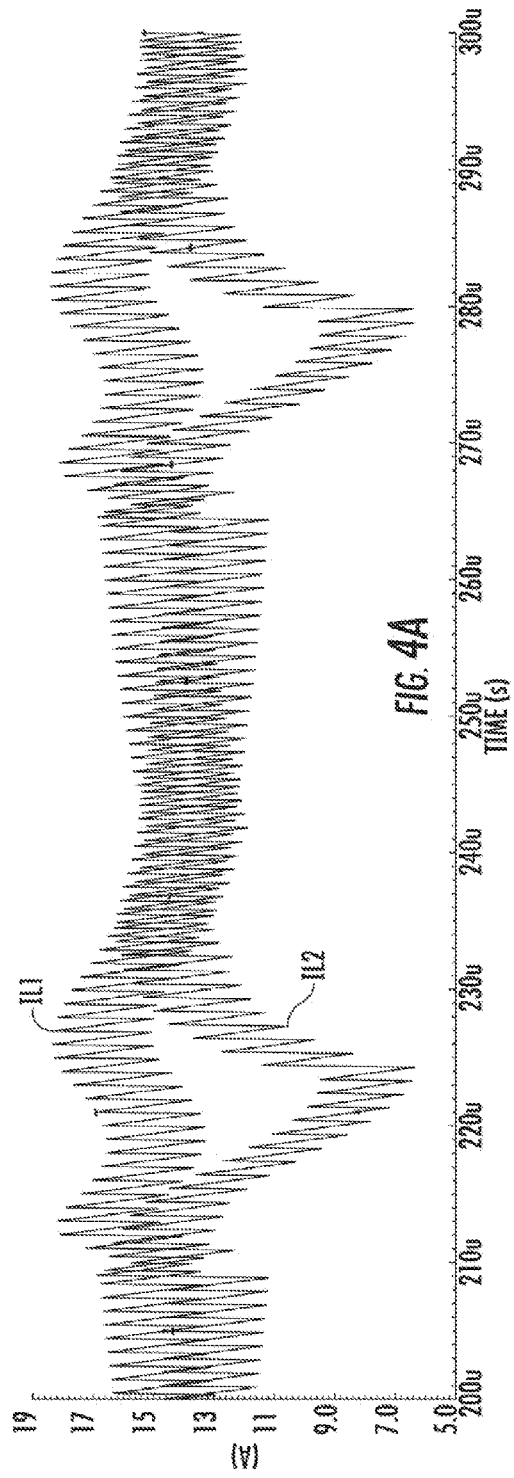
FIG. 4B
FIG. 4A

COMPONENT FAULT DETECTION FOR USE WITH A MULTI-PHASE DC-DC CONVERTER

PRIORITY CLAIMS

This application claims priority under 35 U.S.C. 119(e) to U.S. Provisional Patent Application No. 61/187,598, entitled TWO-PHASE WAY OUT OF BALANCE (WOB) CURRENT CORRECTION FOR USE WITH A TWO-PHASE DC-DC CONVERTER, filed Jun. 16, 2009, and U.S. Provisional Patent Application No. 61/187,607, entitled SOFT START (SS) FAULT DETECTOR FOR USE WITH A TWO-PHASE DC-DC CONVERTER, filed Jun. 16, 2009, both of which are incorporated herein by reference.

RELATED APPLICATIONS

This application relates to commonly invented and commonly assigned U.S. patent application Ser. No. 12/691,438, entitled WAY OUT OF BALANCE (WOB) CURRENT CORRECTION FOR USE WITH A MULTI-PHASE DC-DC CONVERTER, filed Jan. 21, 2010, which is incorporated herein by reference.

BACKGROUND

A DC-DC converter generally converts a direct current from a first voltage level and current level to a second voltage and current level. For example, a step-down DC-DC converter can convert a voltage input (Vin) of 12V at 10 Amps to a voltage output (Vout) of 1.2V approximately at 100 Amps. For a more specific example, a two-phase DC-DC converter can include a pulse width modulator (also simply referred to as a modulator) that includes a first pulse width modulated output (PWM1out) and a second PWM output (PWM2out). The signals output at PWM1out and PWM2out, which can also be referred to as the PMW1out signal and the PWM2out signal, are 180 degrees out of phase. In other words, the PWM2out signal lags (or leads) the PWM1out signal by 180 degrees.

Conventionally, these 180 degrees out of phase signals output by PWM1out and PWM2out directly drive a pair of Driver-MOSFET stages, which can be referred to as DrMOS1 and DrMOS2. The DrMOS1 can be considered to be part of a first channel of the two-phase DC-DC converter, and the DrMOS2 can be considered to be part of a second channel of the two-phase DC-DC converter.

The voltage level output by the DC-DC converter is preferably a regulated voltage level having a relatively tight tolerance (e.g., +/−1%). Further, it is preferred that the two channels of the two-phase DC-DC converter are generally balanced, i.e., each channel handles generally approximately the same amount of power and current, so that one of the two channels is not damaged due to handing too much power and current. However, high frequency load transient events can undesirably affect such a balance between the channels, both adversely affecting the voltage produced by the two-phase DC-DC converter, as well as potentially damaging components within the DC-DC converter. Such high frequency load transient conditions may occur, e.g., when the one or more loads (e.g., a CPU) connected to the voltage outputs for the DC-DC converter power on after previously being powered off, or alternates between a high power operating state (e.g. operating at maximum clock frequency) and a low power operating state (e.g. sleep mode or stand by mode) with relatively high frequency, but are not limited thereto.

A DC-DC converter may experience a fault, e.g., because an inductor and/or a Driver-MOSFET stage, or a portion thereof, is missing, fails, is connected incorrectly, or becomes disconnected. Such faults, if not handled correctly, can cause damage to a DC-DC converter, as well as the larger circuit within which the DC-DC converter is connected.

SUMMARY

Specific embodiments of the present invention are directed to a component fault detection circuit for use with a multi-phase DC-DC converter. Such a multi-phase DC-DC converter can be, e.g., a two-phase DC-DC converter that includes a pulse width modulator adapted to output a first pulse width modulated signal (PWM1out) and a second pulse width modulated signal (PWM2out) that is substantially 180 degrees out of phase from the first pulse width modulated signal (PWM1out). The DC-DC converter can also include first and second driver MOSFET stages (DrMOS1 and DrMOS2), with each DrMOS stage having an input and an output. For example, each DrMOS stage can include a driver and a pair of power field-effect transistors (FETs). Additionally, the DC-DC converter can include a first inductor (L1) having a terminal that is driven in dependence on the output of the first driver MOSFET stage (DrMOS1), and a second inductor (L2) having a terminal that is driven in dependence on the output of the second driver MOSFET stage (DrMOS2). The component fault detection circuit can detect a fault if, e.g., an inductor (e.g., L1 or L2) and/or a Driver-MOSFET stage (e.g., DrMOS1 or DrMOS2) of the DC-DC converter, or a portion thereof, is missing, fails, is connected incorrectly, or becomes disconnected.

In accordance with an embodiment, the component fault detection circuit includes a way out of balance (WOB) detector and a component fault detector. The WOB detector is adapted to detect WOB conditions within the DC-DC converter. The component fault detector is adapted to detect a fault based on detected WOB conditions. For example, the component fault detector can be adapted to detect a fault, if during a predetermined period, one WOB condition occurs at least a specified amount of times more than another WOB condition. The predetermined period can be, e.g., a specified initial portion of a soft start that is time and/or voltage dependent. Additionally, or alternatively, the predetermined period of time can be specified amount of time that is periodically reset during operation of the DC-DC converter. In a further embodiment, the predetermined period can be the last M clock cycles, resulting in the component fault detector essentially monitoring a running average of the WOB conditions.

In accordance with an embodiment, the component fault detector comprises an up/down counter configured to count up (or down) when the first WOB condition is detected, and configured to count in the other direction when the second WOB condition is detected. Using the up/down counter, a fault can be detected when the count value of the counter exceeds a specified threshold.

Embodiments of the present invention are also directed to multi-phase DC-DC converters that include a component fault detection circuit, such as the one described above.

Embodiments of the present invention are also directed to methods for detecting a component fault within a multi-phase DC-DC converter. In accordance with an embodiment, such a method includes monitoring the channels of the DC-DC converter for multiple WOB conditions, and monitoring for a fault based on detected WOB conditions. A fault can be detected, e.g., if during a predetermined period of time, one of the WOB conditions occurs at least a specified amount of times more than another one of the WOB conditions. Additionally, the method can include shutting-down the DC-DC converter and/or another circuit in response to a fault being detected. Additionally, or alternatively, a component fault detection signal can be output in response to a fault being detected.

This summary is not intended to summarize all of the embodiments of the present invention. Further and alternative embodiments, and the features, aspects, and advantages of the embodiments of invention will become more apparent from the detailed description set forth below, the drawings and the claims.

BRIEF DESCRIPTION OF THE DRAWINGS

FIG. 4A shows results of a simulation of a conventional DC-DC converter that show IL1 and IL2 are out of balance to the point they can be considered way out of balance (WOB) at about 220 us and 280 us, which resulted from a simulated high frequency load transient being introduced.

FIG. 4B shows results of a simulation of a DC-DC converter that implements rebalancing in accordance with an embodiment of the present invention, with the same simulated high frequency load transient introduced.

DETAILED DESCRIPTION

Figure 1A:
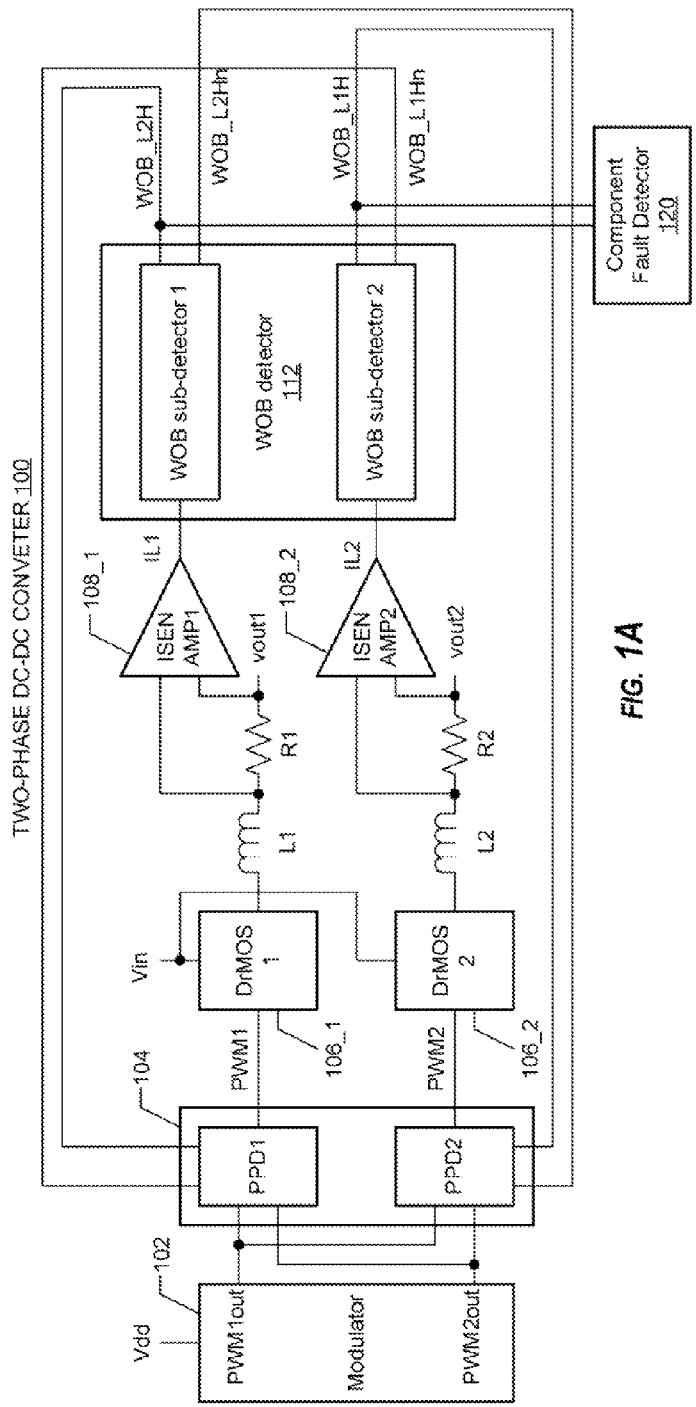
FIG. 1A illustrates a two-phase DC-DC converter that includes a WOB rebalancer, according to an embodiment of the present invention.

FIG. 1A illustrates a two-phase DC-DC converter 100, according to an embodiment of the present invention. Referring to FIG. 1A, the two-phase DC-DC converter 100 includes a pulse width modulator 102 (also simply referred to as a modulator) that includes a first pulse width modulated output (PWM1out) and a second PWM output (PWM2out). The signals output at PWM1out and PWM2out, which can also be referred to as the PMW1out signal and the PWM2out signal, are substantially 180 degrees out of phase. In other words, the PWM2out signal lags (or leads) the PWM1 out signal by substantially 180 degrees. Also shown in FIG. 1A is a component fault detector 120, which is described below in more detail with reference to FIGS. 3 and 12.

Figure 1C:
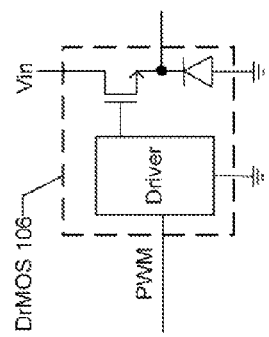
FIGS. 1C and 1D illustrate exemplary additional details of the driver MOSFET stages shown in FIGS. 1A and 1B.
Figure 1D:
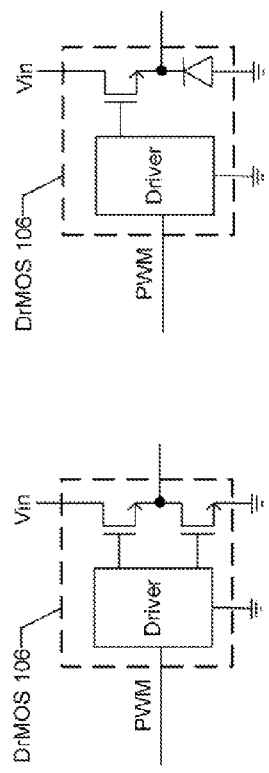

The two-phase DC-DC converter 100 also includes a pair of Driver-MOSFET stages 106_1 and 106_2, shown as DrMOS1 and DrMOS2. In an embodiment, each DrMOS can function as a level shifter that has a low output impedance. For example, each DrMOS can be connected between a 12V rail and ground, can receive a logic-level PWM signal varying between 0 and 5V at its input, and can output a PWM signal having substantially the same pulse width and duty cycle (as the PWM signal received at its input) but varying between 0 and vin (e.g., 12V). To accomplish this, each DrMOS stage 106 may include, e.g., driver circuitry and a pair of power field-effect transistors (FETs), as shown in FIG. 1C. Alternatively, each DrMOS stage 106 can include, e.g., driver circuitry, a single power FET, and a diode, as shown in FIG. 1D. Other DrMOS stage configurations are also possible, and within the scope of the present invention.

The signal input to DrMOS1 will be referred to as PWM1, and the signal input to DrMOS2 will be referred to as PWM2. The DrMOS1 produces a relatively high power square wave signal in response to the relatively low power PWM1 square wave signal input to the DrMOS1. Similarly, the DrMOS2 produces a relatively high power square wave signal in response to the relatively low power PWM2 square wave input to DrMOS1. Conventionally, PWM1 is the same as the PWM1out signal, and PWM2 is the same as the PWM2out signal.

The square wave outputs of the DrMOS1 106_1 and the DrMOS2 106_2 are provided, respectively, to one side (i.e., terminal) of inductors L1 and L2. The currents through the inductors L1 and L2 are saw-tooth signals that are 180 degrees out of phase and equal in amplitude (e.g., peak and average amplitude) when the two channels are perfectly matched and balanced. To sense the current through the inductors, very low resistance (e.g., 1 mΩ) resistors R1 and R2 can be connected to the other side (i.e., terminal) of the inductors L1 and L2 (with the other side/terminal of resistors R1 and R2 being output terminals providing the output voltages vout1 and vout2 of the two-phase DC-DC converter). Alternative circuitry for enabling the sensing of the currents through the two inductors L1 and L2, or more generally the two channels, can be used. For example, instead of having R1 and R2 connected in series with L1 and L2 as shown in FIG. 1, the direct current resistances (DCRs) of the inductors themselves can be used to sense the inductor currents, or resistors R1 and R2 can be connected in parallel with L1 and L2 to extract the series resistance in each inductor. Other variations are possible, and within the scope of the present invention.

In an embodiment, vout1 and vout2 can be connected together (e.g., shorted together) to provide the output (vout) of the DC-DC converter. Additionally, there can be feedback circuitry for providing vout1, vout2 and/or vout, or signals indicative thereof, to the pulse width modulator, e.g., to adjust the duty cycles of PWM1out and PWM2out so that vout1, vout2 and/or vout are at a desired regulated level. However, since such feedback circuitry is well known and not material to the embodiments of the present invention, such feedback circuitry is now shown and is not discussed in further detail.

Figure 1B:
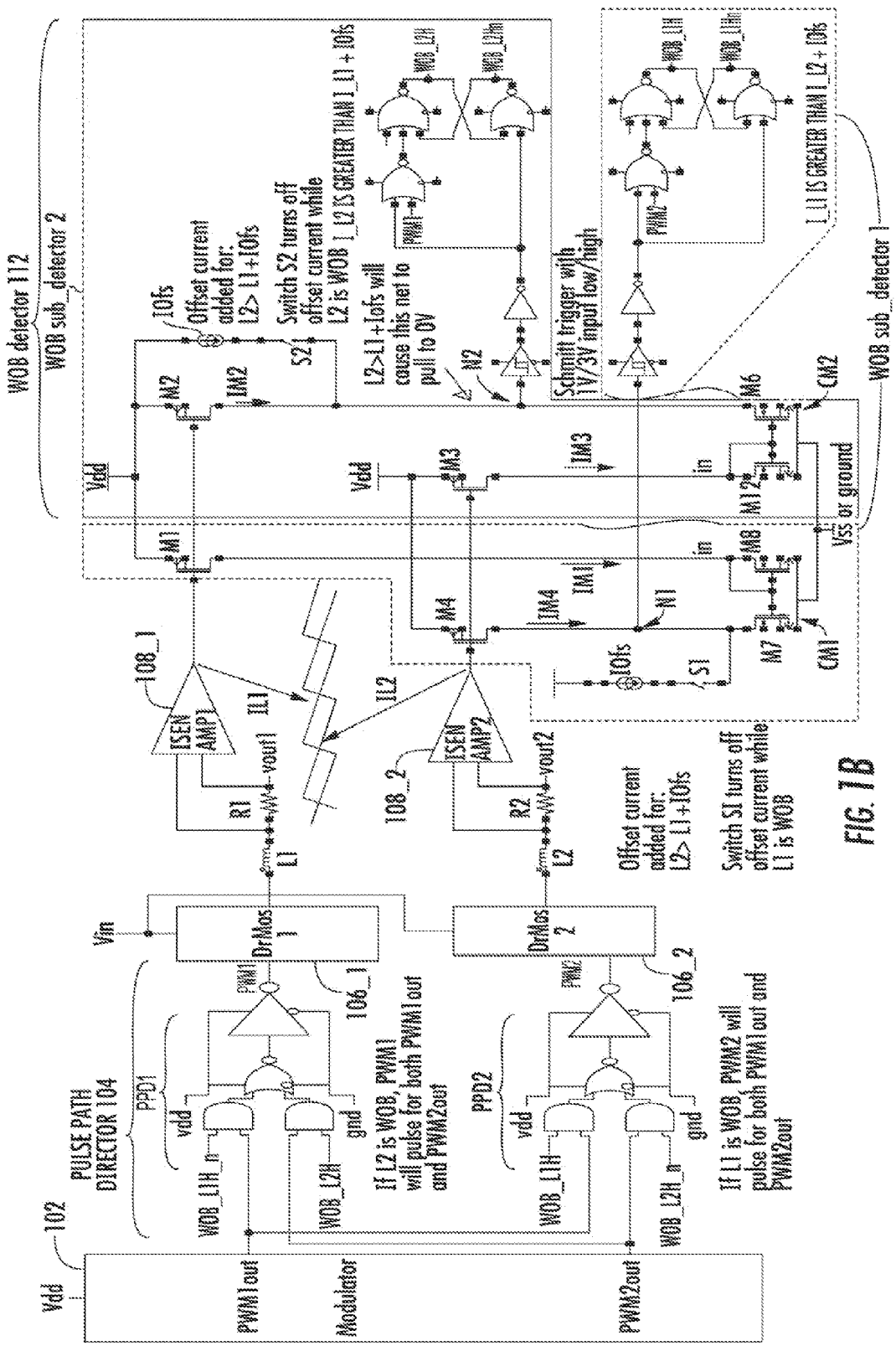
FIG. 1B illustrates additional details of the two-phase DC-DC converter and WOB rebalancer of FIG. 1A, according to a specific embodiment of the present invention.

Also shown in FIG. 1A are a pair of current sense amplifiers ISEN AMP1 and ISEN AMP2, labeled 108_1 and 108_2, that respectively output sense currents IL1 and IL2 indicative of the voltages across resistors R1 and R2, which results in the currents IL1 and IL2 output by the sense amplifiers essentially tracking the currents through the inductors L1 and L2. In other words, the current IL1 is indicative of the current through the inductor L1, and more generally, the current through a first channel of the DC-DC converter. Similarly, the current IL2 is indicative of the current through the inductor L2, and more generally, the current through a second channel of the DC-DC converter. Exemplary sawtooth currents IL1 and IL2 are shown in the middle of FIG. 1B, which is discussed below. Where alternative circuitry is used to sense the currents through the inductors L1 and L2 (e.g., DCR circuitry is used instead of R1 and R2), the inputs to the sense amplifiers ISEN AMP1 108_1 and ISEN AMP2 102_2 may be tapped from different nodes of the circuit.

If the components of the first channel (including DrMOS1, L1 and R1) match perfectly with the components of the second channel (including DrMOS2, L1 and R1), then IL1 and IL2 should have the same amplitude and be 180 degrees out of phase, and both channels will provide the same current and power. However, due to inevitable component mismatches, one channel will tend to provide more current and power than the other channel. There are various well known circuitry and techniques that can be used to compensate for such component mismatches, but such compensation is not the subject of the present invention. Accordingly, circuitry and techniques that compensate for component mismatch are not shown and will not be discussed in further detail.

As mentioned above, the voltage level output by the DC-DC converter is preferably a regulated voltage level having a tight tolerance (e.g., +/−1%). Such a regulated voltage level can be dynamically programmable, e.g. by digital code. Further, it is preferred that the two channels of the two-phase DC-DC converter are generally balanced, i.e., each channel handles generally the same amount of power and current, so that one of the two channels is not damaged due to handing too much power and current. However, high frequency load transient events can undesirably affect such a current and power balance between the channels, both adversely affecting the voltage produced by the two-phase DC-DC converter, as well as potentially damaging components within the DC-DC converter. Such high frequency load transient conditions may occur, e.g., when the one or more loads (e.g., a CPU) connected to the voltage outputs for the DC-DC converter power on after previously being powered off, but is not limited thereto. Specific embodiments of the present invention, described below, can be used to balance the current and power between the two channels of a two-phase DC-DC converter, in response to such high frequency load transient events.

As mentioned above, conventionally PWM1 (i.e., the signal input to DrMOS1) is the same as the PWM1out signal, and PWM2 (i.e., the signal input to DrMOS2) is the same as the PWM2out signal. By contrast, in the embodiment of FIG. 1A, pulse path director (PPD) circuitry 104 is added, which can be thought of as including two sub-PPD directors PPD1 and PPD2. PPD1 and PPD2 each receive both of the PWM1out and PWM2out signals. The signal output by PPD1 is the PWM1 signal provided to DrMOS1, and the signal output by PPD2 is the PWM2 signal provided to DrMOS2. In this manner PPD1 can selectively provide pulses of the PWM1 out signal and/or the PWM2out signal to DrMOS1, and PPD2 can selectively provide pulses of the PWM2out signal and/or the PWM1out signal to DrMOS2. Control of PPD1 and PPD2, or a similar pulse path director, will be discussed below.

FIG. 1B illustrates some exemplary details of PPD1 and PPD2. While each PPD in FIG. 1B is shown as being implemented using a pair of AND gates a NOR gate and an inverter, alternative logic circuitry can be used to perform the pulse redirecting or swapping function of a PPD and are within the scope of the present invention.

Referring again to FIG. 1A, on the right side of the figure is shown a way out of balance (WOB) detector 112, according to an embodiment of the present invention, which detects when the IL1 current and the IL2 current differ from one another by more than a specified offset current (IOfs) for at least a specified period (e.g., two consecutive cycles of the PWM1out and PWM2out signals). FIG. 1B illustrates circuitry that can be used to implement the WOB detector 112, in accordance with a specific embodiment.

Generally, the WOB detector 112 determines in real time when IL1 is greater than IL2 by the specified offset current, and when IL2 is greater than IL1 by the specified offset current, at any point in a cycle of the PWMout1 and PWMout2 signals. If such a WOB condition is detected (e.g., IL1 is greater than IL2 by the specified offset current), but prior to the end of the cycle the condition is no longer detected (e.g., IL1 is no longer greater than IL2 by the specified offset current), then the circuit operates like a convention DC-DC converter in that PWM1 will be the same as PWM1out, and PWM2 will be the same as PWM2out. However, if IL1 remains greater than IL2 by the specified offset current for an entire cycle of the PWM1out signal, then one or more pulses of the PWM1out signal will be moved (redirected) to PWM2, as described in more detail below. Similarly, if IL2 is greater than IL1 by the specified offset current for an entire cycle of the PWM2out signal, then one or more pulses of the PWM2out signal will be moved (redirected) to PWM1.

The WOB detector 112 and pulse path director 104 (e.g., PPD1 and PPD2) help rebalance the two-phase DC-DC converter by moving the one or more pulses output by the modulator 102 from the channel having the higher current to the channel having the lower current. Accordingly, the WOB detector 112 and pulse path director 104 (e.g., PPD1 and PPD2) can collectively be referred to as a WOB rebalancer. The WOB detector 112 detects WOB conditions within the two-phase DC-DC converter. The pulse path director 104 adjusts a balance between a current through the first inductor (L1) and a current through the second inductor (L2), in dependence on feedback from the WOB detector. More generally, the pulse path director 104 adjusts the balance between the currents in the two channels, in dependence on feedback from the WOB detector. Similar techniques can be used if there are more than two channels. For example, where there are more than two channels, for each channel a current can be detected that is indicative of the current through that channel. Additionally, an average of such detected currents can be detected. The current through each channel can be compared to the average channel current, and if the current through a channel is more than a specified offset greater than the average for all of the channels, then a pulse path director can be redirected pulses from a channel with too much current to one or more other channels that have a current below the average channel current. This is just one example how to balance currents through three or more channels. One of ordinary skill in the art reading the description herein would appreciate that other options are available and within the scope of the present invention.

FIG. 1A shows that the WOB detector 112 can be considered to include a WOB sub-detector1 and a WOB sub-detector2. The dashed lines in FIG. 1B separate the circuitry of the WOB detector 112 into the WOB sub-detector1 and the WOB sub-detector2. The WOB sub-detector1 will detect when IL1>IL2 by more than a specified offset. The WOB sub-detector2 will detect when IL2>IL1 by more than a specified offset, which is likely, but not necessarily, the same offset used by WOB sub-detector1. When IL1 and IL2 do not differ by more than the specified offset, then the WOB detector will not detect a WOB condition. In other words, when IL1 and IL2 are within a specified offset of one another they are not way out of balance.

As can be seen in FIG. 1B, the current sense amplifier ISEN AMP1 drives the gates of PMOS transistors M1 and M2. For example, the current sense amplifier ISEN AMP1 can include at its output a diode connected P-channel MOSFET (not shown) that functions as a current mirror master for transistors M1 and M2. The current through the mirror master (i.e., diode connected P-channel MOSFET), which is mirrored by M1 and M2, is dependent on the current being sensed by the current sense amplifier ISEN AMP1 (e.g., the current through R1). The transistors M1 and M2 source currents IM1 and IM2 at their drains, respectively, which are indicative of the magnitude of the IL1 current provided to their gates. For simplicity, it will be assumed that the ratio of M1 and M2 is 1:1.

The current IM1 at the drain of transistor M1 is provided to the input of a current mirror CM1 including NMOS transistors M8 and M7, where M8 is diode connected and thus forms the input of CM1. For simplicity, it is assumed that the ratio of M8 and M7 is 1:1. This results in M7 trying to sink a current to ground that is equal to IM1. A switch S1 selectively provides an offset current IOfs to the drain of M7. Presuming S1 is normally closed, then M7 can sink a current equal to IM1 so long as IM4+IOfs≧IM1. As will be explained below, S1 is closed so long as the current IL1 is not way out of balance (WOB), i.e., is within an acceptable balance.

Because M7 is trying to sink to ground a current that is equal to IM1, if IM4+IOfs<IM1, then the drain of M4 and drain of M7 (i.e., the node N1 formed by these drains) are pulled to the low voltage rail. (The low voltage rail can be vss or ground, but will be presumed to be ground for the remainder of the discussion.) Thus, if M7 can pull the node N1 to ground, that is indicative of channel 1 having significantly more current than channel 2, i.e., channel 1 is WOB. In other words, if M7 is trying to pull more current than is available, the source of the transistor is pulled to ground, and NMOS transistor M7 transitions from the saturation region of operation to the ohmic region.

The other current sense amplifier ISEN AMP2 drives the gates of transistors M4 and M3. For example, the current sense amplifier ISEN AMP2 can include at its output a diode connected N-channel MOSFET (not shown) that functions as a current mirror master for transistors M4 and M3. The current through the mirror master (i.e., diode connected N-channel MOSFET), which is mirrored by M4 and M3, is dependent on the current being sensed by the current sense amplifier ISEN AMP2 (e.g., the current through R2). The transistors M4 and M3 source currents IM4 and IM3 at their drains, respectively, which are indicative of the magnitude of the current IL2 provided to their gates. For simplicity, it will be assumed that the ratio of M4 and M3 is 1:1.

Another current mirror CM2 includes NMOS transistor M6 and M12, where M12 is diode connected and thus forms the input of CM2. The current IM3 at the drain of M3 is provided to the input of CM2, which will result in M6 trying to sink to ground a current equal to M3. A switch S2 selectively provides an offset current IOfs to the drain of M6. Presuming S2 is normally closed, then M6 can sink a current equal to IM3 so long as IM2+IOfs>IM3. As will be explained below, S2 is closed so long as the current IL2 is not way out of balance (WOB), i.e., is within an acceptable balance.

Because M6 is trying to sink to ground a current that is equal to IM3, if IM2+IOfs<IM3, then the drain of M6 and drain of M2 (i.e., the node N2 formed by these drains) are pulled to the low voltage rail. Thus, if M6 can pull the node N2 to ground, that is indicative of channel 2 having significantly more current than channel 1, i.e., channel 2 is WOB. In other words, if M6 is trying to pull more current than is available, the source of transistor is pulled to ground, and NMOS transistor M6 transitions from the saturation region of operation to the ohmic region.

The WOB sub-detector1 includes output circuitry connected to node N1, which will produce one or more outputs indicative of when IL1>IL2+IOfs. In FIG. 1B, the output circuitry includes a Schmitt trigger, an inverter, and three NOR gates, and the output circuit produces WOB_L2H and WOB L2Hn outputs. Alternative circuitry can be used and are within the scope of the present invention. In an embodiment, WOB_L2H goes high when IL1>IL2+IOfs, and WOB L2Hn is complimentary. Similarly, the WOB sub-detector2 includes output circuitry connected to node N2, which will produce one or more outputs indicative of when IL2>IL1+IOfs. In FIG. 1, the output circuitry includes a Schmitt trigger, an inverter, and three NOR gates, and the output circuit produces WOB_L1H and WOB_L1Hn outputs. Alternative circuitry can be used and are within the scope of the present invention. In an embodiment, WOB_L1H goes high when IL2>IL1+ IOfs, and WOB_L1Hn is complimentary. In FIG. 1, WOB_L1Hn and WOB_L2H are provided to PPD1 to control PPD1, and WOB_L1H and WOB_L2H n are provided to PPD2 to control PPD2.

When the WOB sub-detector1 detects that IL1>IL2+IOfs (which can be referred to as IL1 is WOB), two things happen simultaneously: the switch S1 is opened so that IOfs is no longer provided to node N1; and the detection of IL1>IL2+ IOfs is used to control PPD1 and PPD2. More specifically, when IL1 is WOB when PWM1out from the modulator goes high, PPD1 and PPD2 will be controlled to cause PWM2 (i.e., the input to DrMOS2) to receive the pulses of both the PWM1out and PWM2out signals while blocking PWM1out (i.e., input to DrMOS1 remains low), to attempt to rebalance the two channels. In other words, a pulse that would normally be used to drive the DrMOS1 will be moved to the other channel to instead drive the DrMOS2.

Similarly, when the WOB sub-detector2 detects that IL2>IL1+IOfs (which can be referred to as IL2 is WOB), two things happen simultaneously: the switch S2 is opened so that IOfs is no longer provided to node N2; and the detection of IL2>IL1+IOfs is used to control PPD1 and PPD2. More specifically, when IL2 is WOB when PWM2out from the modulator goes high, PPD1 and PPD2 will be controlled to cause PWM1 (i.e., the input to DrMOS1) to receive the pulses of both the PWM1out and PWM2out signals while block PWM2out (i.e., input to DrMOS2 remains low), to attempt to rebalance the two channels. In other words, a pulse that would normally be used to drive the DrMOS2 will be moved to the other channel to instead drive the DrMOS1.

If desired, to provide for hysteresis, an additional pair of current sources can be added, one of which is connected to between node N1 and ground, and another one which is connected between node N2 and ground. Such current sources can be used to selectively sink currents from nodes N1 and N2 to ground. A switch for the additional current source connected between node N1 and ground could be closed when switch S1 is open, and a switch for the additional current source connected between node N2 and ground would be closed when switch S2 is open. The hysteresis is added to help the system return closer to balance instead of just on the edge of WOB.

In an embodiment, this moving of pulses can take two cycles to develop. More specifically, on cycle 1, PWM1 can sufficiently increase the current through the inductor L1 so that WOB_L1H goes high (i.e., the WOB sub-detector1 detects that IL1>IL2+IOfs). Thereafter (e.g., about 500 ns later), in response to PWM2, the DrMOS2 will provide a pulse to the inductor L2. Normally this increase in current through the inductor L2 will reset the WOB_L1H signal back to low. However, if the high side and low side channels are out of balance, WOB_L1H can remain high during cycle 2. When the next pulse of the PWM1out signal is output by the modulator, the pulse path director (e.g., PPD1 and PPD2) will provide that pulse to PWM2 (i.e., to the input of DrMOS2), rather than PWM1 (i.e., rather than to the input of DrMOS1). The WOB rebalancer will also provide the next pulse of the PWM2out signal to PWM2 (i.e., to the input of DrMOS2), resulting in the DrMOS2 receiving both the pulse intended for DrMOS1 as well as the pulse intended for DrMOS2, while the DrMOS1 did not receive any pulses. In this manner, the system can be rebalanced by adjusting phase order.

In accordance with specific embodiments, additionally circuitry can be provided to ensure that neither DrMOS receives too many pulses, which may damage a DrMOS and/or inductor. For example, such addition circuitry can be used to make sure that neither DrMOS ever receives more than X out of the last Y pulses output by the modulator 102, where X>Y (e.g., X=3 and Y=2).

Figure 2:
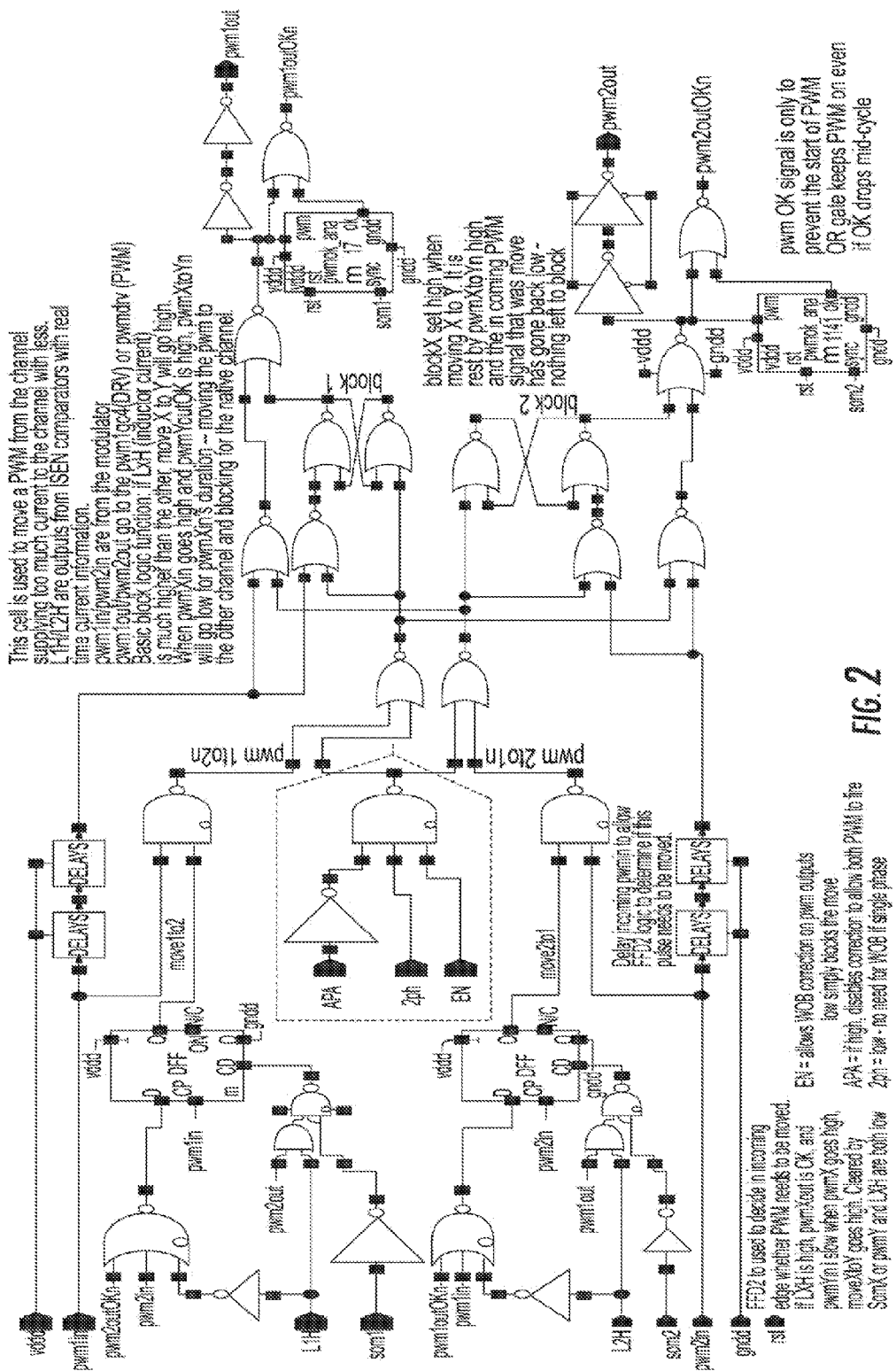
FIG. 2 shows circuitry, according to an embodiment, to implement the pulse path director introduced in FIG. 1A.

FIG. 2 shows circuitry, according to an embodiment, to implement PPD1 and PPD2 (or more generally, the pulse path director 104) in a manner that makes sure that neither DrMOS receives too many pulses. Accordingly, such circuitry can be referred to as limiter circuitry, because it limits the amount of pulses that may be received/moved. Further circuitry shown in FIG. 2 ensures that entire pulses are moved, as opposed to only moving portions of pulses. FIG. 2 also includes circuitry that allows for the enabling and disabling of the pulse path director 104.

Figure 3:
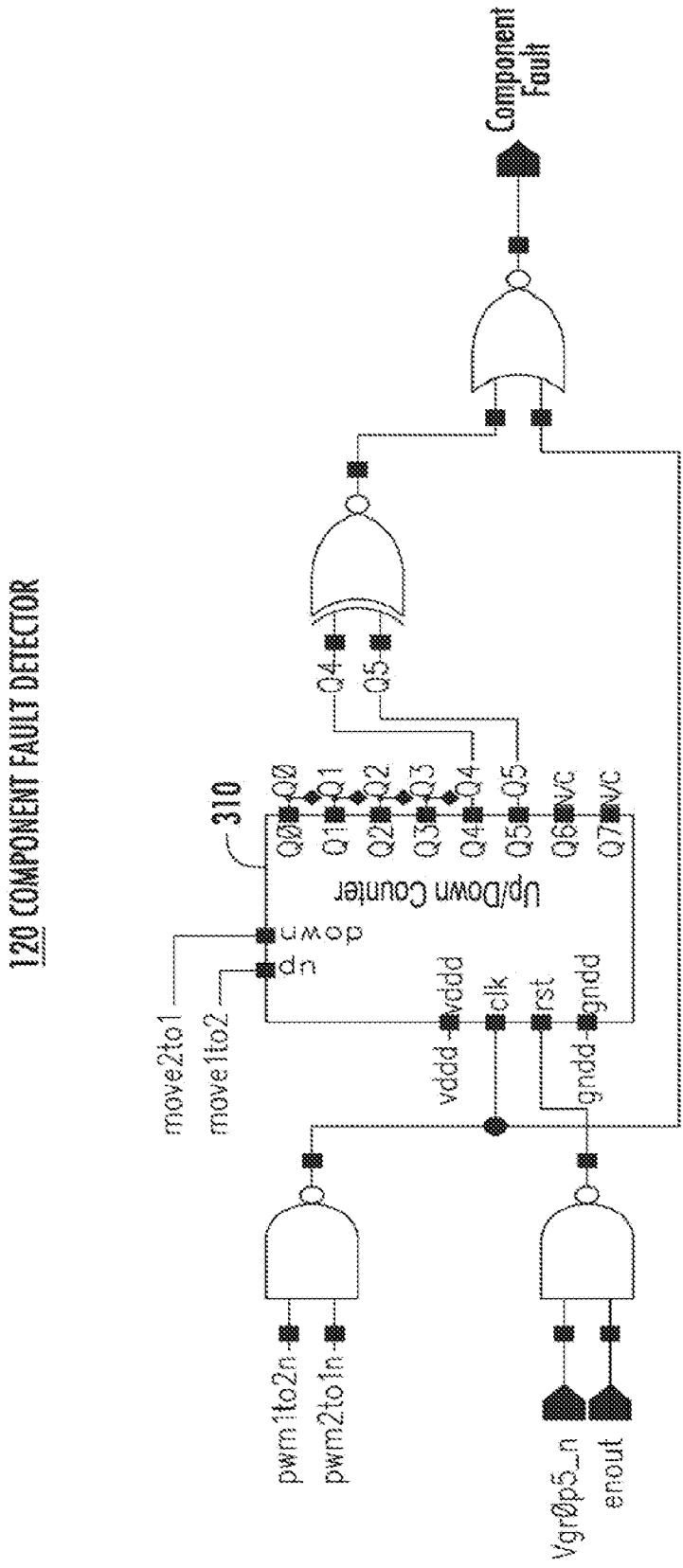
FIG. 3 illustrates a component fault detector, according to an embodiment of the present invention.

FIG. 3 illustrates exemplary details of the component fault detector 120. The component fault detector 120 can use information/signals learned/derived from the circuits of FIGS. 1 and 2, to determine if there is a fault, e.g., during start-up of the DC-DC converter 100. For example, the component fault detector of FIG. 3 can be used to determine when one of the inductors (L1 or L2) or DrMOSs (DrMOS1 or DrMOS2), or a portion thereof, is missing, has failed, or is not connected correctly. Details of FIG. 3 are discussed later below.

FIG. 4A shows results of a simulation of a conventional DC-DC converter that show IL1 and IL2 are out of balance to the point they can be considered WOB at about 220 us and 280 us, which results from a simulated high frequency load transient introduced. FIG. 4B shows results of a simulation of the same DC-DC converter but with the WOB rebalancer added and used, with the same simulated high frequency load transient introduced. As can be appreciated from FIG. 4B, the WOB rebalancer will cause the currents IL1 and IL2 through inductors L1 and L2, respectively, to track one another more closely, which is desirable. More generally, the WOB rebalancer will cause the current and power in the two channels to more closely track one another.

Figure 5:
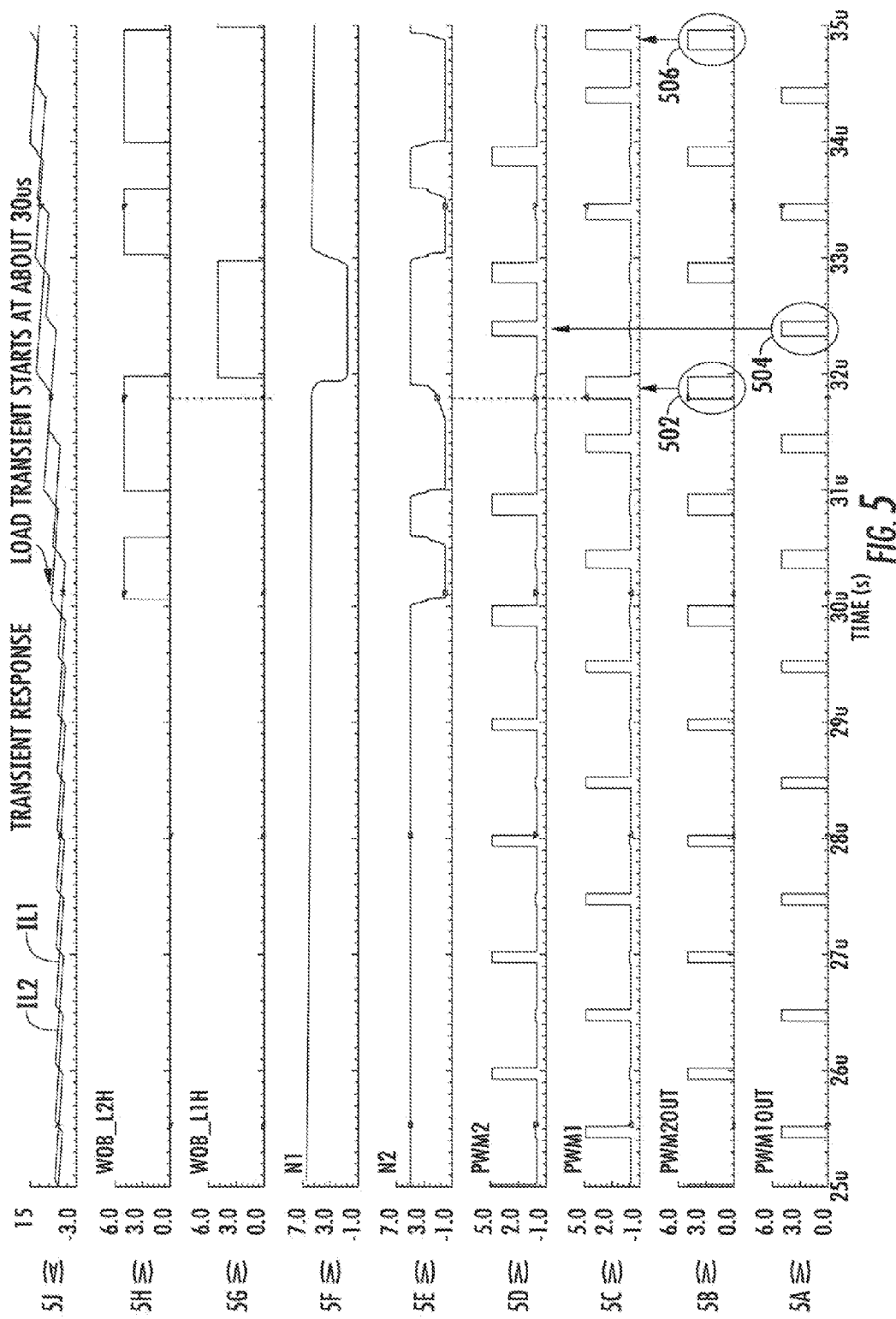
FIG. 5 (which includes 5A-5J) illustrates simulated waveform diagrams that are used to show details of how multiple pulses can be moved from one channel to another, using the embodiment of FIGS. 1A and 1B, to balance the two channels of the two-phase DC-DC converter.

The waveforms of FIGS. 5A-5J (collectively referred to as FIG. 5) are used to show more details of the operation of the embodiment of FIG. 1. FIGS. 5A and 5B, respectively, show the PWM1out and PWM2out signals output by the modulator in FIG. 1. FIGS. 5C and 5D, respectively, show the PWM1 signal input to DrMOS1 and the PWM2 signal input to DrMOS2. Stated another way, FIG. 5C shows the output of PPD1 and FIG. 5D shows the output of PPD2. FIGS. 5E and 5F are, respectively, the voltages at nodes N2 and N1 in FIG. 1, which are the voltages provided to the output circuitry of the WOB sub-detector2 and the WOB sub-detector1. FIGS. 5G and 5H are, respectively, the logic high signals WOB_1H and WOB_2H output by the WOB sub-detector1 and the WOB sub-detector2. More specifically, WOB_L1H goes high in response to node N1 being pulled to ground when IL1>IL2+IOfs, and WOB_L2H goes high in response to node N2 being pulled to ground when IL2>IL1+IOfs. FIG. 5J are the sense current signals IL1 and IL2 that are indicative of the currents through inductors L1 and L2.

In FIG. 5, a high frequency load transient begins at about 30 us. As can be appreciated from FIG. 5, prior to 30 us, the voltages at nodes N1 and N2 remain at substantially 5V, causing WOB_L1H and WOB_L2H to remain low, which causes PWM1 to track (i.e., be substantially equal to) PWM1out and PWM2 to track PWM2out. However, starting at about 30 us, node N2 is pulled to ground for 0.5 us, returns to 5V for about 0.5 us, and then is pulled to ground for about another 1us, which causes WOB_L2H to go high while N2 is pulled to ground. The load transient also causes the node N1 to be pulled to ground for about 1us starting at about 32 us, which causes WOB_L1H to go high while N1 is pulled to ground. The WOB_L1H and WOB_L2H signals, and there complements WOB_L1Hn and WOB L2Hn, are used to control PPD1 and PPD2, as was described above. This results in pulses 502 and 506 (in FIG. 5B) of PWM2out being moved to PWM1 (in FIG. 5C), and pulse 504 (in FIG. 5A) of PWM1out being moved to PWM2 (in FIG. 5D), to balance the two channels of the two-phase DC-DC converter.

Figure 6:
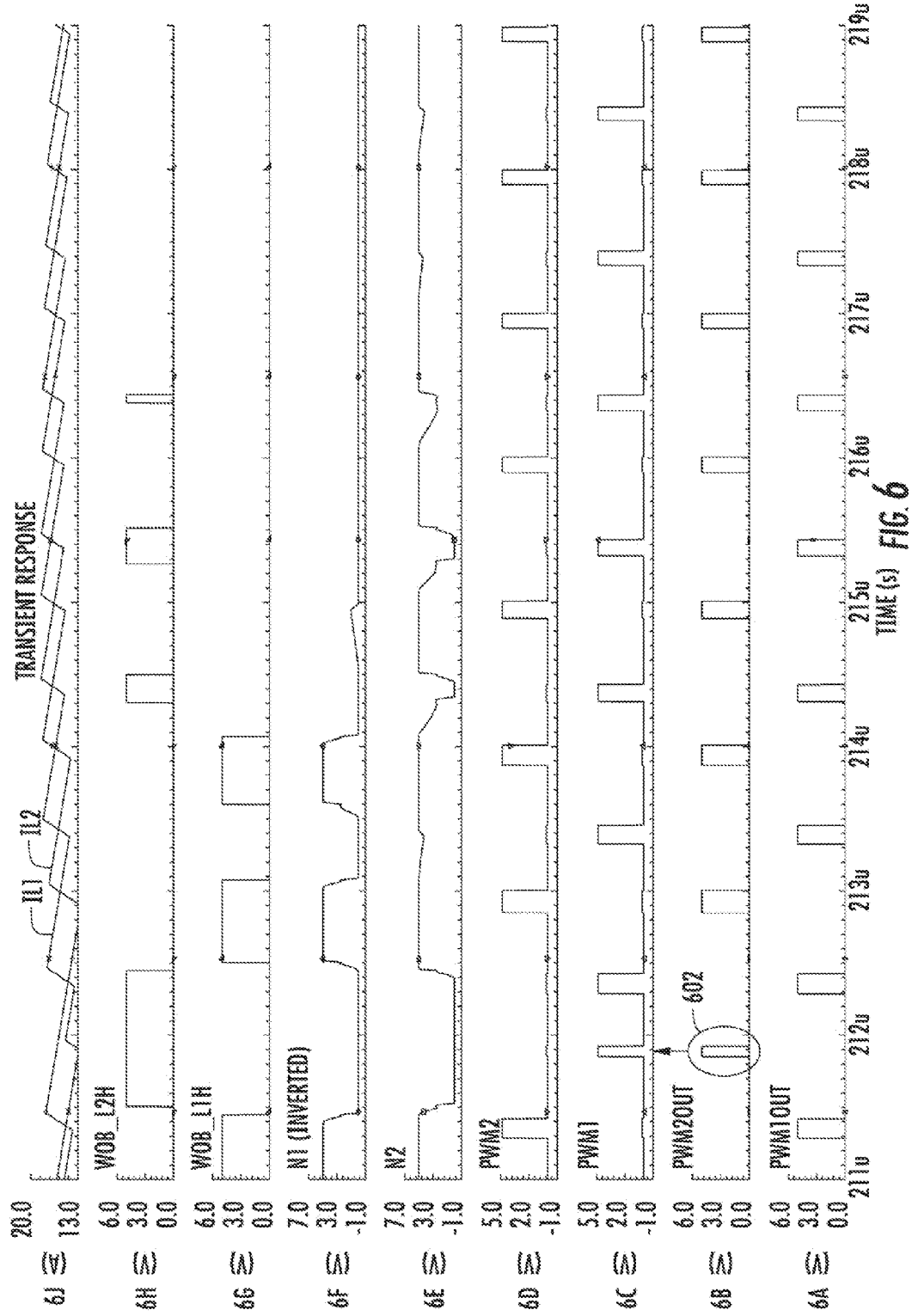
FIG. 6 (which includes 6A-6J) is similar to FIG. 5, but with only one pulse being moved from PWM2out to PWM1 and no pulses being moved to PWM1out to PWM2.

FIG. 6 is similar to FIG. 5, but with only one pulse 602 being moved from PWM2out to PWM1 and no pulses being moved to PWM1out to PWM2.

Figure 7:
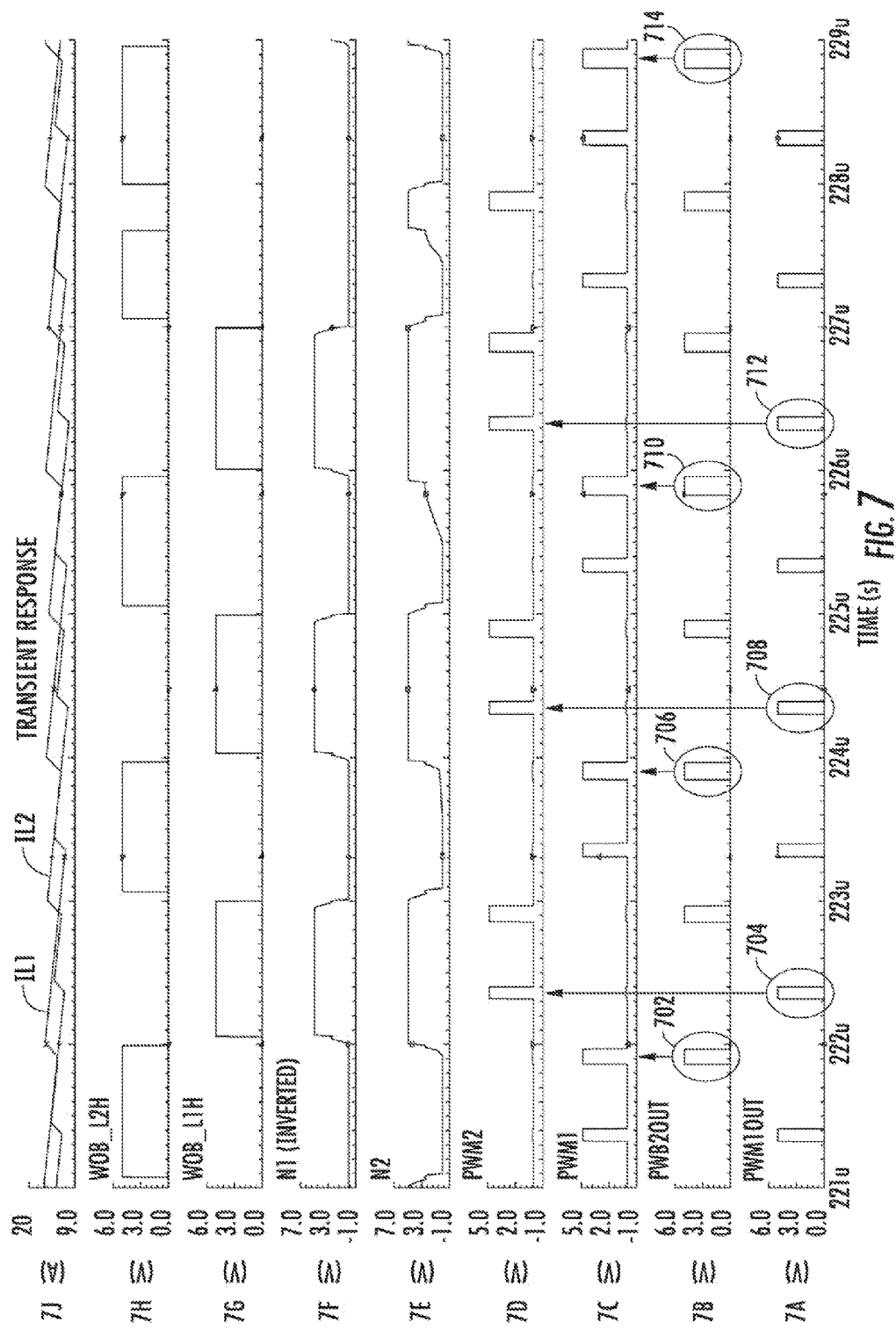
FIG. 7 (which includes 7A-7J) is similar to FIGS. 5 and 6, but with a harsher high frequency load transient applied in the simulation, which results in many more pulses being moved from PWM1out to PWM2, and from PWM2out to PWM1.

FIG. 7 is similar to FIGS. 5 and 6, but with a harsher high frequency load transient applied in the simulation, which results in more pulses (i.e., pulses 704, 708 and 712) being moved from PWM1out to PWM2, and more pulses (i.e., pulses 702, 706 and 710) being moved from PWM2out to PWM1.

Figure 8:
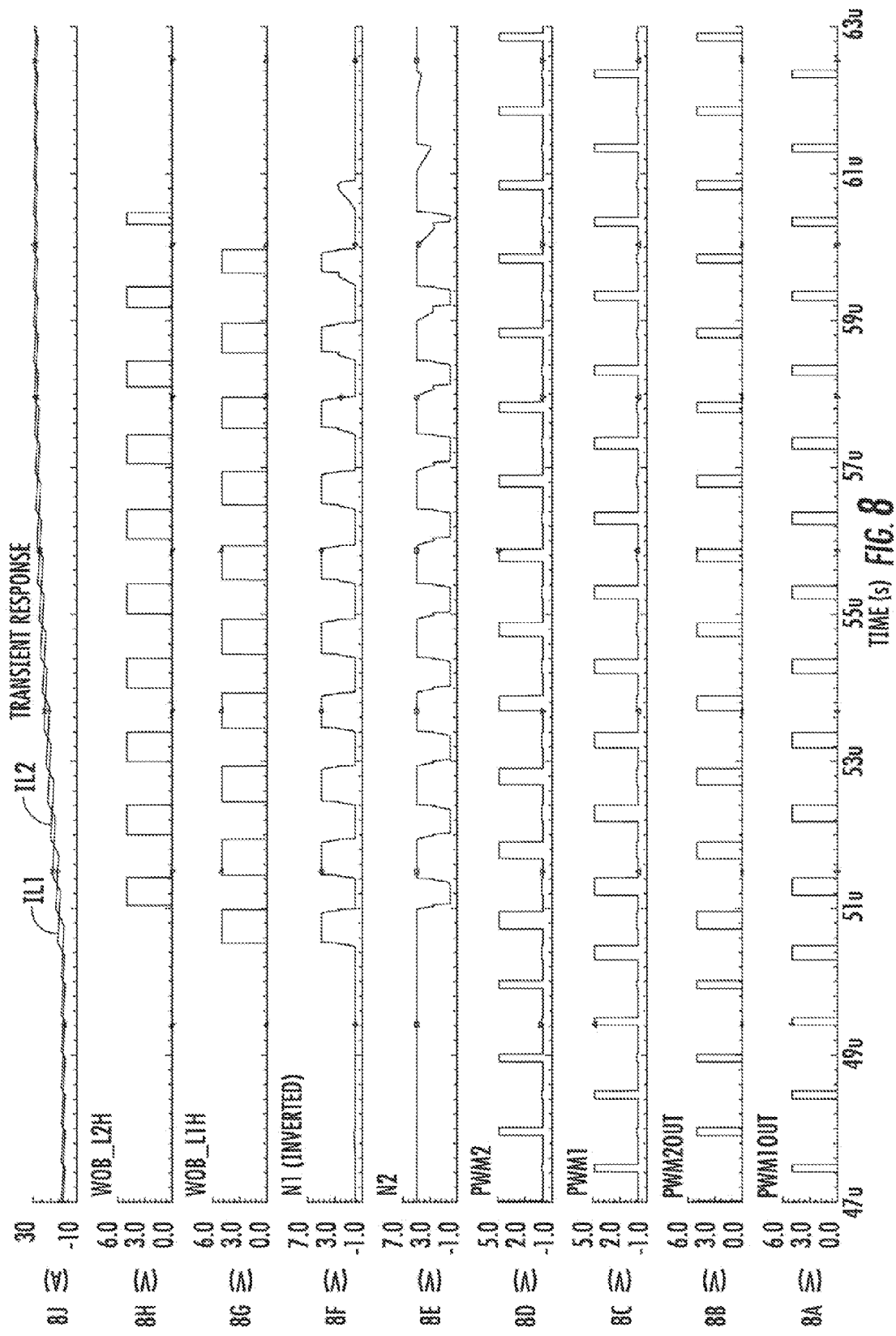
FIG. 8 (which includes 8A-8J) and FIG. 9 (which includes 9A-9J) are similar to FIGS. 5-7 for different simulated responses.
Figure 9:
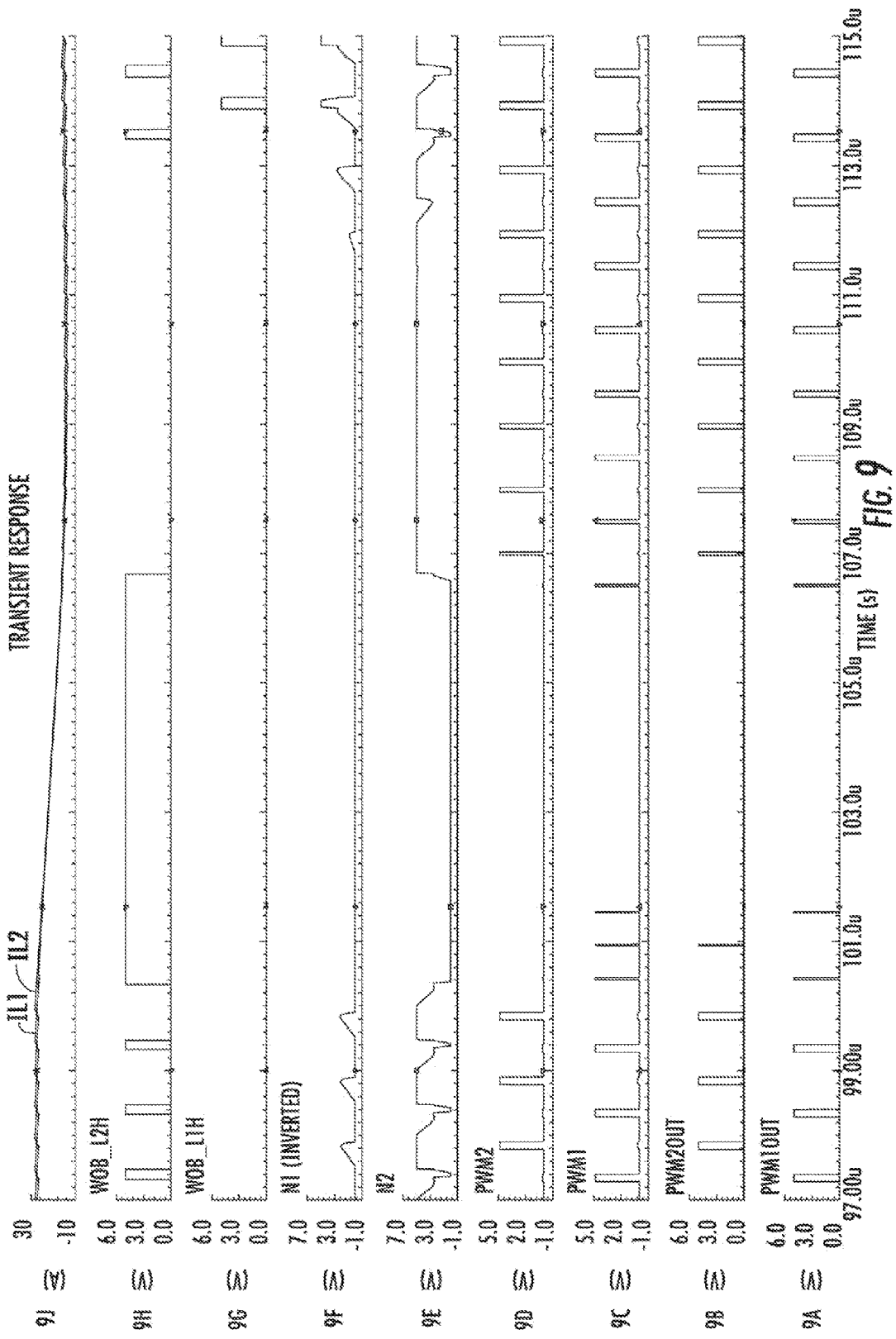

FIGS. 8 and 9 are similar to FIGS. 5-7, but for different simulated responses.

Referring again to FIG. 1A, in specific embodiments the pulse path director 104 receives the first and second pulse width modulated signals (PWM1out and PWM2out) from the pulse width modulator 102. Additionally, the pulse path director 104 selectively provide pulses of the first and second pulse width modulated signals (PWM1out and PWM2out) to the inputs of the first and second driver MOSFET stages (DrMOS1 and DrMOS2), in dependence on feedback from the WOB detector 112, to adjust a balance between the first current (IL1) and the second current (IL2) and thereby adjust the balance between the current through the first inductor (L1) and the current through the second inductor (L2). In an embodiment, the pulse path director 104 selectively provides individual pulses of the first pulse width modulation signal (PWMout1) to the input of first driver MOSFET stage (DrMOS1) or the input of the second driver MOSFET stage (DrMOS2), and selectively provides individual pulses of the second pulse width modulation signal (PWMout2) to the input of first driver MOSFET stage (DrMOS1) or the input of the second driver MOSFET stage (DrMOS2).

In another embodiment, the pulse path directed 104 swaps phases of the first and second pulse width modulated signals (PWM1out and PWM2out) output by the pulse width modulator 102, before the first and second pulse width modulated signals (PWM1out and PWM2out) are provided to the first and second driver MOSFET stages (DrMOS1 and DrMOS2). Again, this is done to adjust a balance between the first current (IL1) and the second current (IL2) and thereby adjust the balance between the currents through the first and second inductors (L1 and L2).

More generally, the pulse path director 102 adjusts a balance between currents in the various channels of a multi-phase DC-DC converter to thereby balance the current and power in the channels.

Figure 12:
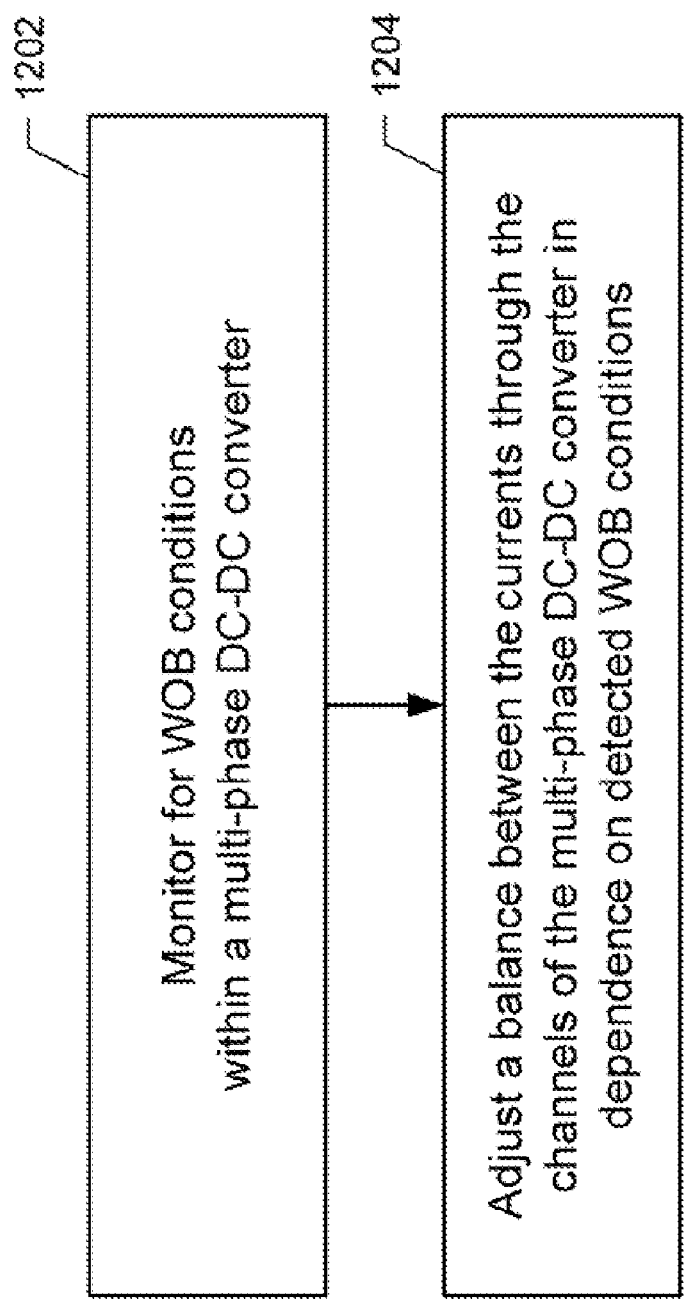
FIG. 12 is a high level flow diagram that is used to summarize various methods of the present invention that can be used to rebalance currents through a multi-phase DC-DC converter.

FIG. 12 will now be used to summarize various methods of the present invention that can be used to rebalance currents through a multi-phase DC-DC converter. Referring to FIG. 12, at step 1202 WOB conditions are monitored for within a multi-phase DC-DC converter. Further, as indicated at step 1204, a balance between the currents through the multiple channels of the multi-phase DC-DC converter are adjusted, in dependence on WOB conditions detected at step 1204.

In accordance with specific embodiments, step 1202 can include detecting a first WOB condition when a first current (IL1) indicative of the current through a first inductor (e.g., L1 in FIGS. 1A and 1B) is more than a predetermined offset current greater than the a second current (IL2) indicative of the current through a second inductor (e.g., L2 in FIGS. 1A and 1B). Additionally, step 1202 can include detecting a second WOB condition when the second current (IL2) indicative of the current through the second inductor (L2) is more than a predetermined offset current greater than the first current (IL1) indicative of the current through the first inductor (L2). More generally, step 1202 can include detecting a first WOB condition when a first current indicative of the current through a first channel of the DC-DC converter is more than a predetermined offset current greater than the a second current indicative of the current through a second channel of the DC-DC converter. Additionally, step 1202 can include detecting a second WOB condition when the second current through the second channel of the DC-DC converter is more than a predetermined offset current greater than the first current through the first channel of the DC-DC converter. Because the WOB conditions described herein relate to currents being way out of balance, a WOB condition may be more specifically referred to as a "WOB current condition". Thus, the first WOB condition may be referred to as the "first WOB current condition", and the second WOB condition may be referred to as the "second WOB current condition".

In accordance with specific embodiments, step 1204 can include selectively providing pulses of first and second pulse width modulated signals (e.g., PWM1out and PWM2out) to the inputs of first and second driver MOSFET stages (e.g., DrMOS1 and DrMOS2 in FIGS. 1A and 1B), in dependence on the WOB conditions detected at step 1202, to adjust a balance between the first current (e.g., IL1) and the second current (e.g., IL2). This will have the affect of adjusting the balance between the currents in the two channels, e.g., adjusting the current through the first inductor (L1) and the current through the second inductor (L2). This can include selectively providing individual pulses of the first pulse width modulation signal (PWMout1) to the input of first driver MOSFET stage (DrMOS1) or the input of the second driver MOSFET stage (DrMOS2), and selectively providing individual pulses of the second pulse width modulation signal (PWMout2) to the input of first driver MOSFET stage (DrMOS1) or the input of the second driver MOSFET stage (DrMOS2).

In accordance with other embodiments, step 1204 can include swapping phases of first and second pulse width modulated signals (e.g., PWM1out and PWM2out), output by the pulse width modulator, before the first and second pulse width modulated signals (PWM1out and PWM2out) are provided to the first and second driver MOSFET stages (e.g., DrMOS1 and DrMOS2 in FIGS. 1A and 1B), to adjust a balance between the currents in the two channels.

Reference will now be made again to FIG. 3, which as mentioned above, is an embodiment of the component fault detector 120 that can be used to determine when there is a fault, e.g., due to one of the inductors (L1 or L2) or DrMOSs (DrMOS1 or DrMOS2), or a portion thereof, missing, having failed, not being connected correctly, or becoming disconnected. In one embodiment, this is achieved by counting the number of pulses that are moved from PWM1 out to PWM2 and/or PWM2out to PWM1. If the number of pulses moved in one direction exceed the number of pulses moved in the other direction by at least a specified threshold amount, e.g., during system start-up, that is indicative of a fault. Such a fault, when detected, can be used to shut-down the circuit to avoid or minimize damage to the larger circuit within which the DC-DC converter is used. Additionally, or alternatively, such a fault, when detected, can be used to produce a component fault detection signal that can be provided to another subsystem. It is also noted that the component fault detector can be used during periods other than start-up, or soft start, as explained below.

Referring to FIG. 3, a digital up/down counter 310 is shown as including an up input, a down input, a clock (clk) input, a reset (rst) input, and a plurality of outputs (shown as Q0-Q7, with Q0 being the least significant bit (LSB)). The up input of the up/down counter 310 is shown as receiving a pulse whenever a pulse is moved from PWM1 out to PWM2, and the down input is shown as receiving a pulse whenever a pulse is moved from PWM2out to PWM1 (but the inputs to the up and down inputs may be reversed). The clock input is shown as receiving a clock signal produced using a NAND gate and pwm1to2$n$ and pwm2to1$n$ signals produced in FIG. 2, but is not limited thereto. For example, the clock signal can alternatively be generated by OR-ing the PWMout1 and PWMout2 signals. A second NAND gate will reset the digital up/down counter in response to a specified condition, e.g., a reference voltage that ramps up during a soft start condition reaches a specified voltage (e.g., 0.5V). In the configuration of FIG. 3, the up/down counter will count up and/or down from the time the chip (within which the up/down counter is located) is enabled until a reference voltage being ramped up reaches 0.5V. Such a reference voltage can be, e.g., the output of a digital to analog converter (DAC), but is not limited thereto. If the up/down counter 310 counts up (or down) to a specified count value (e.g., 16) prior to the reference voltage reaching the specified level (e.g., 0.5V), then a soft start fault (SS fault) is detected. However, if the counter does not count up (or down) to the specified value (e.g., 16) by the time the reference voltage reaches the specified level (e.g., 0.5V), then the input to the reset pin goes high and remains high (until a power down and another soft start occurs) and a fault is not detected.

Since the moving of pulses is a result of the WOB conditions detected by the WOB detector 112, the component fault detector 120 is in essence monitoring how often one WOB condition occurs more than another. In other words, the component fault detector 120 can detect a fault if, during a predetermined period of time, one of the WOB conditions occurs at least a specified amount of times more than another one of the WOB conditions.

Referring back to FIG. 1A, in accordance with an embodiment the component fault detector 120 monitors the output of the WOB detector 112 during a specified period (e.g., a soft start) of the DC-DC converter (or more generally, a specified period, such as a soft start, of the larger circuit within which the DC-DC converter is located). If during an initial portion of the soft start (which can be time and/or voltage dependent) one channel of the DC-DC converter is WOB more than the other channel by at least a specified threshold amount (e.g., the first channel is WOB 16 more times than the second channel, or vice versa), then a SS fault is detected, otherwise a SS fault is not detected. For a more specific example, if the first channel is WOB 20 times during the initial portion of a soft start, while the second channel is WOB only 4 times during the initial portion of the soft start, then an SS fault condition can be detected since the first channel was WOB 16 more times than the second channel.

The component fault detector 120 can be used during other periods besides start up, e.g., by periodically resetting the up/down counter 310 after start-up. If one channel is WOB at least the specified threshold amount more than the other channel, before the counter 310 is reset, then a fault condition is detected. As mentioned above, when a fault is detected, the DC-DC converter can be shut-down to avoid or minimize damage to the larger circuit within which the DC-DC converter is used. Such a shut-down can occur, e.g., by tri-stating the outputs of the MOSFETs of the driver MOSFET states, but is not limited thereto. Additionally, or alternatively, such a fault, when detected, can be used to produce a component fault detection signal that can be provided to another subsystem, that can store component fault detection information and/or determine and control how to deal with the detected fault.

The component fault detector 120 can be used with or without the WOB rebalancer described in detail above, so long as a circuit includes at least the WOB detector 112 circuit. Accordingly, the WOB detector 112 can be considered to be part of a component fault detection circuit. In other words, a component fault detection circuit can be considered to also include the WOB detector 112 described herein and the component fault detector 120, or a similar such circuit.

Figure 10:
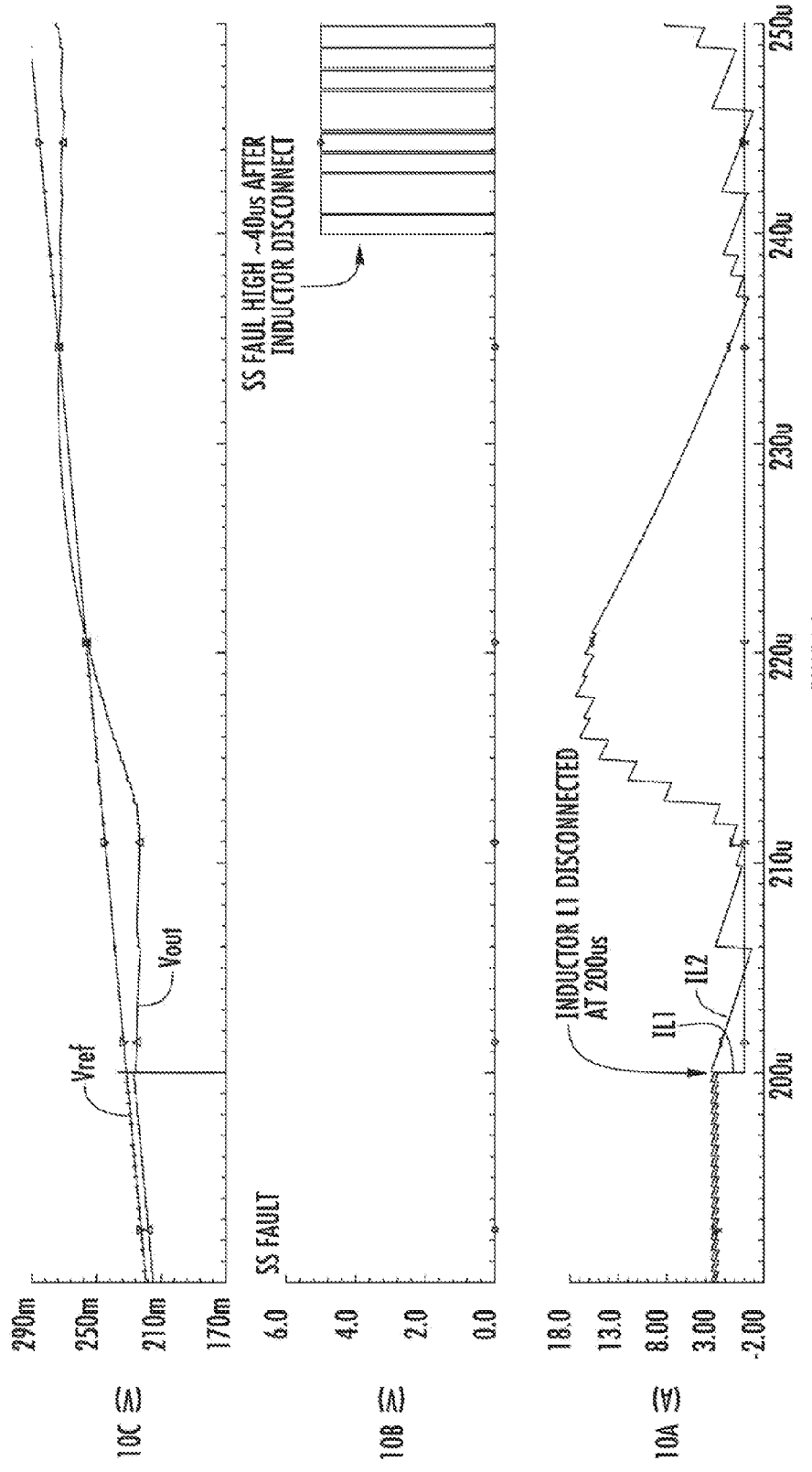
FIG. 10 (which includes 10A-10C) and FIG. 11 (which includes 11A-11F) show simulations where the inductor L1 of FIGS. 1A and 1B is disconnected at 200 us.
Figure 17:
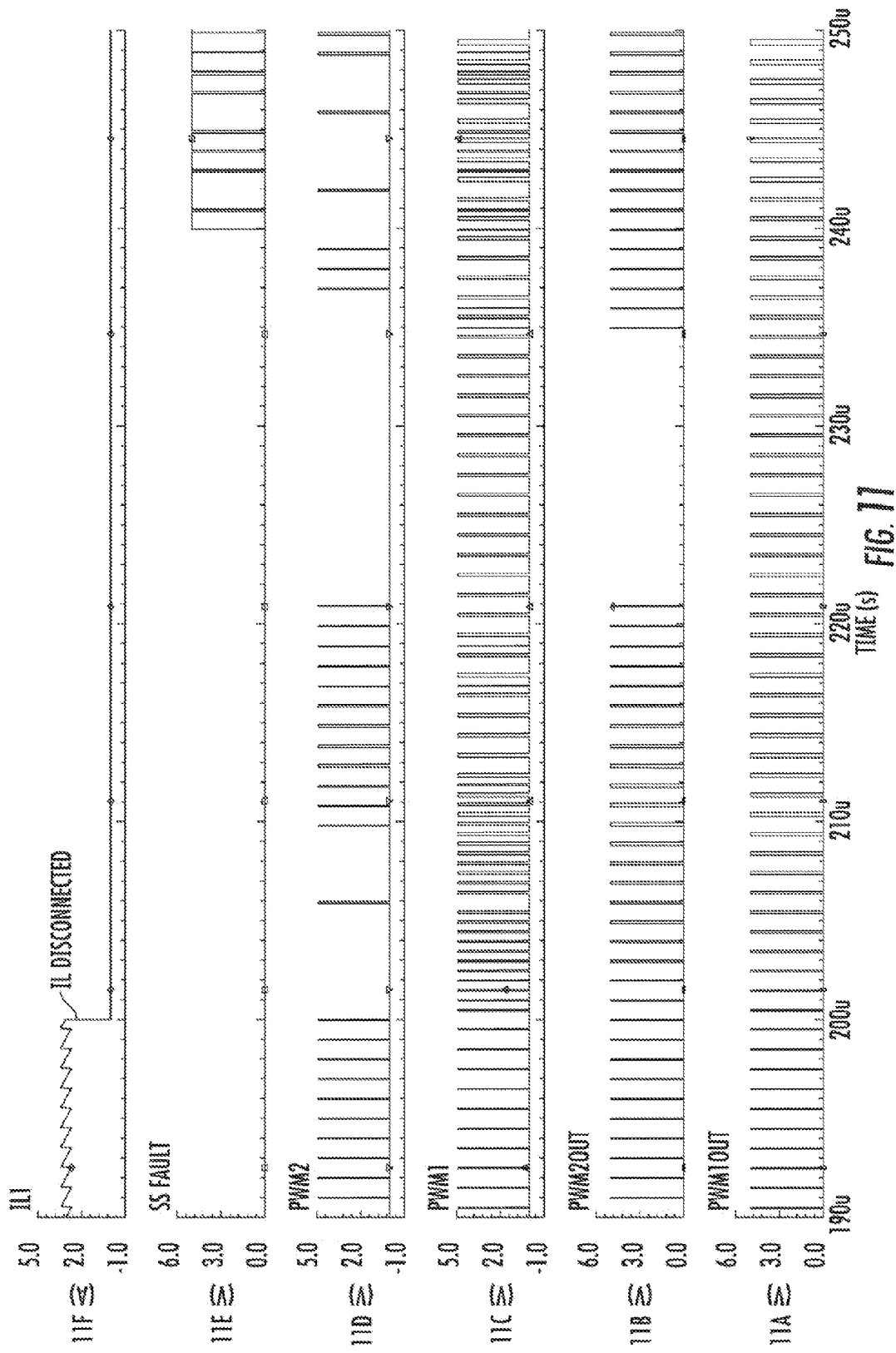

FIG. 10 (which includes FIGS. 10A-10C) and FIG. 11 (which includes FIGS. 11A-11F) show simulations where the inductor L1 of FIG. 1 is disconnected at 200 us. As can be appreciated from FIGS. 10B and 11E, this will result in the SS Fault signal (labeled in FIG. 3) going high about 40 us after disconnection of the L1 inductor. In this example, the SS Fault goes high after 16 more pulses of PWM1out are moved (redirected) to PWM2, as compared to pulses moved from PWM2out to PWM1.

Figure 13:
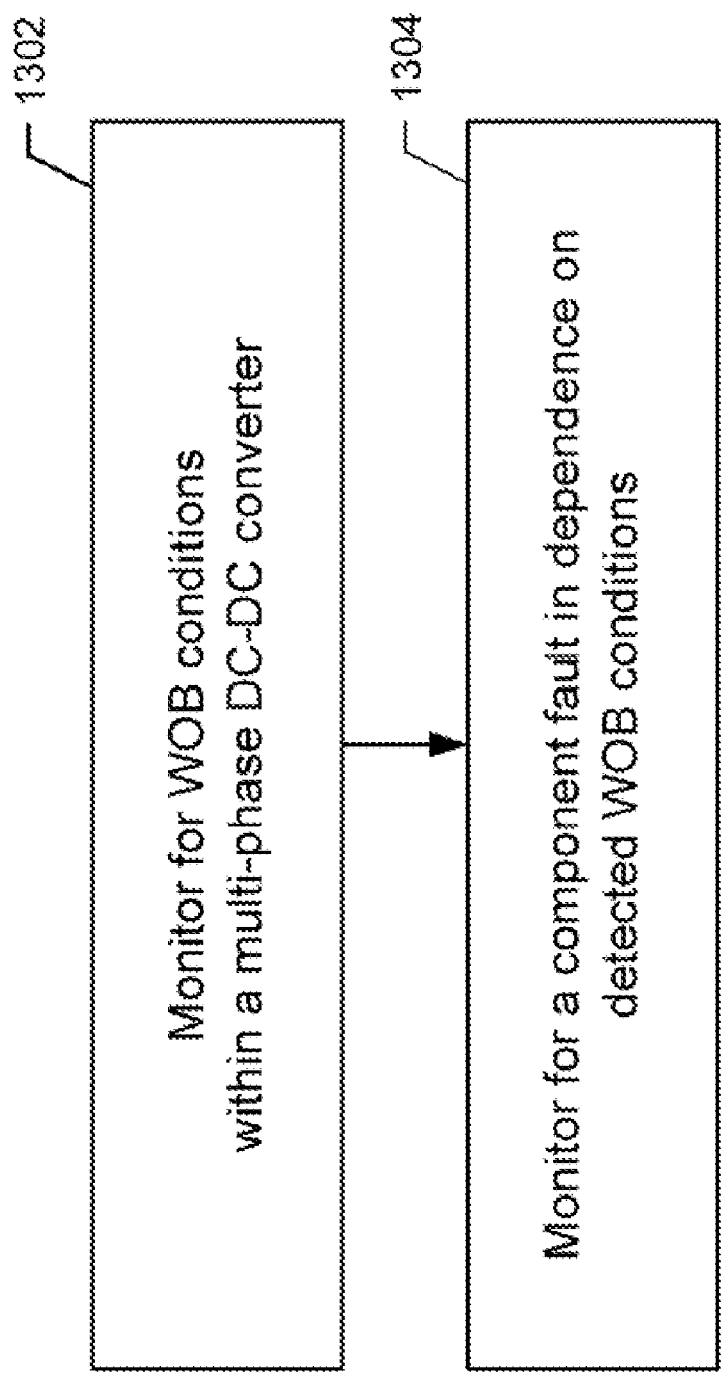
FIG. 13 is a high level flow diagram that is used to summarize various methods of the present invention that can be used to detect a component fault within a multi-phase DC-DC converter.

FIG. 13 is a high level flow diagram that is used to summarize various methods of the present invention that can be used to detect a component fault within a multi-phase DC-DC converter. Referring to FIG. 13, at step 1302, the channels of the multi-phase DC-DC converter are monitored for WOB conditions. Step 1302 is similar to step 1202 described above, and thus need not be described again in detail. At step 1304, a component fault is monitored for in dependence on detected WOB conditions. For example, a fault can be detected at step 1304 if during a predetermined period of time one of the WOB conditions occurs at least a specified amount of times more than another one of the WOB conditions. The predetermined period of time can be, e.g., a specified initial portion of a soft start. Additionally, or alternatively, the predetermined period of time can be specified amount of time that is periodically reset during operation of the DC-DC converter. In a further embodiment, the predetermined period can be the last M clock cycles, resulting in the component fault detector essentially monitoring a running average of the WOB conditions. As mentioned above, a component fault can occur, e.g., if an inductor (e.g., L1 or L2) and/or a Driver-MOSFET stage (e.g., DrMOS1 or DrMOS2) of the DC-DC converter, or a portion thereof, is missing, fails, is connected incorrectly, or becomes disconnected.

Figure 14:
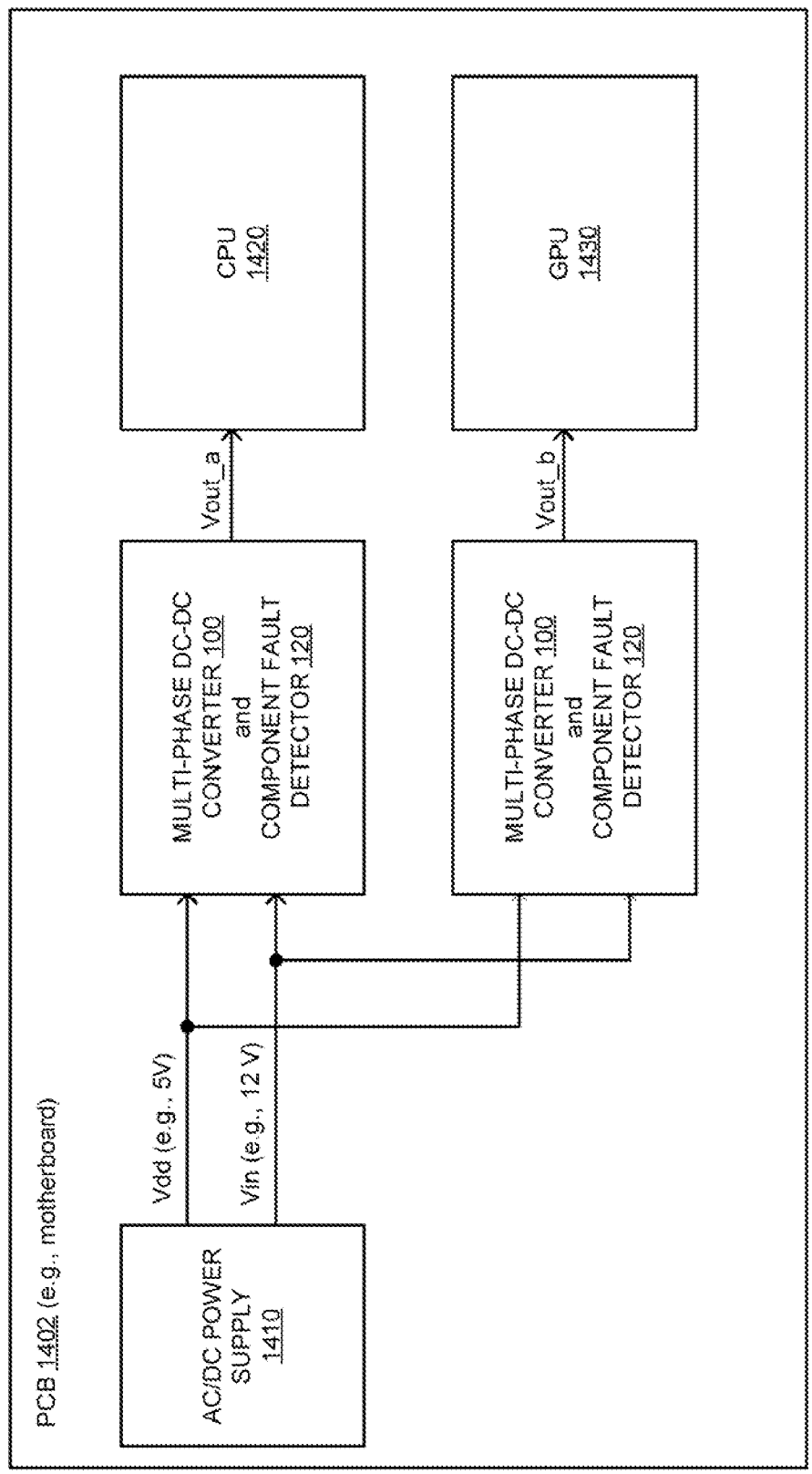
FIG. 14 is a block diagram of an exemplary system that implements embodiments of the present invention.

FIG. 14 is a block diagram of a portion of exemplary system (e.g., a computer system) that includes a pair of multi-phase DC-DC converters 100, each of which also has a corresponding component fault detector 120. Referring to FIG. 14, the system includes a printed circuit board (PCB) 1402, e.g., a mother board, on which is located an AC/DC power supply 1410 which provides Vdd (e.g., 5V) and Vin (e.g., 12V) to each of the multi-phase DC-DC converters 100. It is also possible that Vdd and Vin be the same, e.g., 12V, in which case the AC/DC power supply need only produce a single voltage level. The AC/DC power supply 1410 can alternatively be located external the PCB 1402. One of the multi-phase DC-DC converters 100 is shown as being used to produce a first voltage level (Vout_a) that is used to power a central processing unit (CPU) 1420. The other multi-phase DC-DC converter 100 is shown as being used to produce a second voltage level (Vout_b) that is used to power a graphics processing unit (GPU) 1430, or used to power a second CPU (e.g., as is often done in a server that has multiple CPUs). Vout_a and Vout_b can be the same, or different, depending on the power requirements of the CPU 1420 and the GPU 1430. Within each multi-phase DC-DC converter 100 is a WOB rebalancer, which includes a WOB detector 112 and pulse path director 104. The portion of the system shown in FIG. 14 can be used in a computer system that also includes other modules, such as, but not limited to, memory (e.g., a random access memory (RAM), flash memory, cache memory, or the like), a storage device (e.g., a hard disk, DVD-R/RW, CD-R/RW or RAM), a wired interface module (e.g., a USB, RS-232 serial port, Ethernet card), a wireless interface module configured to communicate using a wireless protocol (e.g., Bluetooth, WiFi, IEEE 802.11, or the like), a display, etc.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations, e.g. having more than two channels/phases, and/or applying the invention to DC/DC converter topologies other than the illustrated buck converter topology, are believed to be within the spirit and scope of the present invention. It is intended that the scope of the invention be defined by the following claims and their equivalents.

What is claimed is:

1. A component fault detection circuit for use with a two-phase DC-DC converter that includes
   a pulse width modulator adapted to output a first pulse width modulated signal (PWM1out) and a second pulse width modulated signal (PWM2out) that is substantially 180 degrees out of phase from the first pulse width modulated signal (PWM1out),
   a first channel including a first driver MOSFET stage (DrMOS1) having an input and an output, and a first inductor (L1) having a terminal that is driven in dependence on the output of the first driver MOSFET stage (DrMOS1), a second channel including a second driver MOSFET stage (DrMOS2) having an input and an output, and a second inductor (L2) having a terminal that is driven in dependence on the output of the second driver MOSFET stage (DrMOS2), wherein the component fault detection circuit comprises:

a way out of balance (WOB) detector adapted to detect WOB conditions within the two-phase DC-DC converter; and a component fault detector adapted to detect a fault in dependence on how often one of the WOB conditions detected by the WOB detector occurs relative to another one of the WOB conditions.

2. The component fault detection circuit of claim 1, wherein the WOB detector is adapted to detect a first WOB condition when a current through the first channel is more than a specified threshold more than a current through the second channel, and detect a second WOB condition when a current through the second channel is more than a specified threshold more than a current through the first channel.

3. The component fault detection circuit of claim 1, wherein the component fault detector is adapted to detect a fault, if during a predetermined period, one of the first WOB condition and the second WOB condition occurs at least a specified amount of times more than the other.

4. The component fault detection circuit of claim 3, wherein the predetermined period comprises a specified initial portion of a soft start.

5. The component fault detection circuit of claim 3, wherein the predetermined period of time is periodically reset during operation of the DC-DC converter and/or the predetermined period of time is a last specified number of clock cycles during operation of the DC-DC converter.

6. The component fault detection circuit of claim 1, wherein the component fault detector comprises an up/down counter configured to count one of up and down when the first WOB condition is detected, and configured to count the other one of up and down when the second WOB condition is detected.

7. A method for use with a two-phase DC-DC converter that includes a pulse width modulator adapted to output a first pulse width modulated signal (PWM1out) and a second pulse width modulated signal (PWM2out) that is substantially 180 degrees out of phase from the first pulse width modulated signal (PWM1out), a first channel including a first driver MOSFET stage (DrMOS1) having an input and an output, and a first inductor (L1) having a terminal that is driven in dependence on the output of the first driver MOSFET stage (DrMOS1), a second channel including a second driver MOSFET stage (DrMOS2) having an input and an output, and a second inductor (L2) having a terminal that is driven in dependence on the output of the second driver MOSFET stage (DrMOS2), wherein the method comprises:

(a) monitoring for way out of balance (WOB) conditions within the two-phase DC-DC converter; and (b) monitoring for a component fault in dependence on how often one of the detected WOB conditions occurs relative to another one of the WOB conditions.

8. The method of claim 7, wherein:

step (a) includes (a.i) detecting a first WOB condition when a current through the first channel is more than a specified threshold more than a current through the second channel; and (a.ii) detecting a second WOB condition when a current through the second channel is more than a specified threshold more than a current through the first channel; and step (b) includes detecting a component fault if one of the first WOB condition and the second WOB condition occurs at least a specified amount of times more than the other during a predetermined period of time.

9. The method of claim 8, wherein the predetermined period of time is periodically reset during operation of the DC-DC converter and/or the predetermined period of time is a last specified number of clock cycles during operation of the DC-DC converter.

10. The component fault detection circuit of claim 8, wherein step (b) comprises:

incrementing a count value when one of the first and second WOB conditions is detected;

decrementing the count value when the other one of the first and second WOB conditions is detected; and detecting a fault when the count value exceeds a specified threshold.

11. A multi-phase DC-DC converter, comprising:

a pulse width modulator adapted to output N pulse width modulated signals having different phases from one another, where $N \geq 2$;

N channels each including a driver MOSFET stage having an input and an output, and an inductor having a terminal that is driven in dependence on the output of the driver MOSFET stage;

a way out of balance (WOB) detector adapted to monitor with N channels for multiple WOB conditions; and a component fault detector adapted to detect a fault in dependence on how often one of the WOB conditions detected by the WOB detector occurs relative to another one of the WOB conditions.

12. The multi-phase DC-DC converter of claim 11, wherein the component fault detector is adapted to detect a fault, if during a predetermined period of time, one of the WOB conditions occurs at least a specified amount of times more than another one of the WOB conditions.

13. The DC-DC converter of claim 12, wherein the predetermined period of time comprises a specified initial portion of a soft start.

14. The DC-DC converter of claim 13, wherein the predetermined period of time is periodically reset during operation of the DC-DC converter and/or the predetermined period of time is a last specified number of clock cycles during operation of the DC-DC converter.

15. The DC-DC converter of claim 11, wherein the DC-DC converter is configured to be shut-down in response to the fault being detected.

16. The DC-DC converter of claim 11, wherein the component fault detector is configured to output a component fault detection signal in response to the fault being detected.

17. A method for use with multi-phase DC-DC converter that includes a pulse width modulator adapted to output N pulse width modulated signals having different phases from one another, where $N \geq 2$;

N channels each including a driver MOSFET stage having an input and an output, and an inductor having a terminal that is driven in dependence on the output of the driver MOSFET stage;

the method comprising:
(a) monitoring the N channels of the DC-DC converter for multiple WOB conditions; and
(b) monitoring for a component fault in dependence on how often one of the detected WOB conditions occurs relative to another one of the WOB conditions.

18. The method of claim 17, where step (b) includes detecting a component fault, if during a predetermined period of time, one of the WOB conditions occurs at least a specified amount of times more than another one of the WOB conditions.

19. The method of claim 18, wherein the predetermined period of time comprises a specified initial portion of a soft start.

20. The method of claim 18, wherein the predetermined period of time is periodically reset during operation of the DC-DC converter and/or the predetermined period of time is a last specified number of clock cycles during operation of the DC-DC converter.

21. The method of claim 17, further comprising shutting-down the DC-DC converter and/or another circuit in response to a component fault being detected.

22. The method of claim 17, further comprising outputting a component fault detection signal in response to a component fault being detected.

23. A system, comprising:
a multi-phase DC-DC converter adapted to convert a first DC voltage (Vin) to a second DC voltage (Vout), wherein the multi-phase DC-DC converter includes
a pulse width modulator adapted to output N pulse width modulated signals having different phases from one another, where $N \geq 2$,
N channels each including a driver MOSFET stage having an input and an output, and an inductor having a terminal that is driven in dependence on the output of the driver MOSFET stage,
a way out of balance (WOB) detector adapted to detect WOB conditions within the multi-phase DC-DC converter, and
a component fault detector adapted to detect a fault in dependence on how often one of the WOB conditions detected by the WOB detector occurs relative to another one of the WOB conditions;
an AC/DC power supply adapted to produce the first DC voltage (Vin), wherein the first DC voltage (Vin) is used for powering the driver MOSFET stages of the N channels; and
a processing unit adapted to be powered by the second DC voltage (Vout) produced by the multi-phase DC-DC converter.

24. A method for use with a DC-DC converter that includes
a pulse width modulator adapted to output a first pulse width modulated signal (PWM1out) and a second pulse width modulated signal (PWM2out),
a first channel including a first driver MOSFET stage (DrMOS1) having an input and an output, and a first inductor (L1) having a terminal that is driven in dependence on the output of the first driver MOSFET stage (DrMOS1),
a second channel including a second driver MOSFET stage (DrMOS2) having an input and an output, and a second inductor (L2) having a terminal that is driven in dependence on the output of the second driver MOSFET stage (DrMOS2),
wherein the method comprises:
(a) monitoring for WOB conditions within the DC-DC converter;
(b) providing pulses of the first pulse width modulated signal (PWM1out) to the first channel, and providing pulses of the second pulse width modulated signal (PWM2out) to the second channel, when a WOB condition is not detected;
(c) selectively moving one or more pulses of the first pulse width modulated signal (PWM1out) to the second channel, in response to a first WOB condition being detected;
(d) selectively moving one or more pulses of the second pulse width modulated signal (PWM2out) to the first channel, in response to a second WOB condition being detected; and
(e) monitoring for a component fault in dependence on how often pulses of the first pulse width modulated signal (PWM1out) are moved to the second channel, relative to how often pulses of the second pulse width modulated signal (PWM2out) are moved to the first channel.

* * * * *